(12) United States Patent
Ruile et al.

(10) Patent No.: US 9,257,960 B2
(45) Date of Patent: Feb. 9, 2016

(54) ELECTROACOUSTIC TRANSDUCER HAVING REDUCED LOSSES DUE TO TRANSVERSE EMISSION AND IMPROVED PERFORMANCE DUE TO SUPPRESSION OF TRANSVERSE MODES

(75) Inventors: Werner Ruile, Munich (DE); Markus Mayer, Taufkirchen (DE); Ulrike Rösler, Hebertshausen (DE); Markus Hauser, Feldafing (DE); Ingo Bleyl, Munich (DE); Karl-Christian Wagner, Unterhaching (DE); Wolfgang Sauer, Taufkirchen (DE); Michael Jakob, Munich (DE); Thomas Ebner, Munich (DE); Edgar Schmidhammer, Stein an der Traun (DE); Stefan Berek, Munich (DE); Christoph Eggs, Rattenkirchen (DE)

(73) Assignee: EPCOS AG, Munich (DE)

( * ) Notice: Subject to any disclaimer, the term of this patent is extended or adjusted under 35 U.S.C. 154(b) by 648 days.

(21) Appl. No.: 13/520,533

(22) PCT Filed: Sep. 15, 2010

(86) PCT No.: PCT/EP2010/063562
§ 371 (c)(1),
(2), (4) Date: Nov. 13, 2012

(87) PCT Pub. No.: WO2011/088904
PCT Pub. Date: Jul. 28, 2011

(65) Prior Publication Data
US 2013/0051588 A1    Feb. 28, 2013

(30) Foreign Application Priority Data

Jan. 25, 2010 (DE) .......................... 10 2010 005 596

(51) Int. Cl.
*H03H 9/145* (2006.01)
*H03H 9/02* (2006.01)
*H03H 3/08* (2006.01)

(52) U.S. Cl.
CPC ............ *H03H 9/14532* (2013.01); *H03H 3/08* (2013.01); *H03H 9/02535* (2013.01); *H03H 9/02858* (2013.01); *H03H 9/1457* (2013.01); *H03H 9/1455* (2013.01); *Y10T 29/42* (2015.01)

(58) Field of Classification Search
CPC . H03H 9/1544; H03H 9/1455; H03H 9/1457; H03H 9/14532; H03H 9/02858
USPC .............................. 310/313 R, 313 A, 313 D
See application file for complete search history.

(56) References Cited

U.S. PATENT DOCUMENTS 6,617,752 B2   9/2003  Nakao et al.
7,453,334 B1   11/2008 Abbott et al.
(Continued)

FOREIGN PATENT DOCUMENTS

DE           103 31 323 A1   2/2005
DE     10 2005 061 800 A1   6/2007
(Continued)

OTHER PUBLICATIONS

Mayer, M., et al., "Low Loss Recursive Filters for Basestation Applications Without Spurious Modes," IEEE Ultrasonics Symposium, vol. 2, Sep. 18-21, 2005, pp. 1061-1064.
(Continued)

*Primary Examiner* — Derek Rosenau
(74) *Attorney, Agent, or Firm* — Slater & Matsil, L.L.P.

(57) ABSTRACT

An electroacoustic transducer has reduced loss due to acoustic waves emitted in the transverse direction. For this purpose, a transducer comprises a central excitation area, inner edge areas flanking the central excitation area, outer edge areas flanking the inner edge areas, and areas of the busbar flanking the outer edge areas. The longitudinal speed of the areas can be set so that the excitation profile of a piston mode is obtained.

31 Claims, 18 Drawing Sheets

(56) References Cited

U.S. PATENT DOCUMENTS

| | | | |
|---|---|---|---|
| 7,538,637 B2 | 5/2009 | Mayer et al. | |
| 7,576,471 B1 | 8/2009 | Solal | |
| 2007/0018755 A1 | 1/2007 | Mayer et al. | |
| 2008/0315972 A1* | 12/2008 | Mayer et al. | 310/313 R |
| 2011/0068655 A1* | 3/2011 | Solal et al. | 310/313 B |
| 2013/0051588 A1 | 2/2013 | Ruile et al. | |

FOREIGN PATENT DOCUMENTS

| | | |
|---|---|---|
| EP | 1 962 424 A1 | 5/2003 |
| EP | 1 871 006 A1 | 12/2007 |
| JP | H0715272 A | 1/1995 |
| JP | 11-101350 A | 4/1999 |
| JP | H11298286 A | 10/1999 |
| JP | 2000-183681 A | 6/2000 |
| JP | 2001267880 A | 9/2001 |
| JP | 2002223143 A | 8/2002 |
| JP | 2006217517 A | 8/2006 |
| JP | 2007-507130 A | 3/2007 |
| JP | 2007096527 A | 4/2007 |
| JP | 2009-521142 A | 5/2009 |
| JP | 2009290472 A | 12/2009 |
| JP | 2010-212543 A | 9/2010 |
| JP | 2011-101350 A | 5/2011 |
| JP | 05-005958 B2 | 8/2012 |
| JP | 2013518455 A | 5/2013 |
| WO | WO 03/038997 A1 | 5/2003 |
| WO | WO 2007/0732722 A1 | 7/2007 |

OTHER PUBLICATIONS

Mayer, M., et al., "Simulation of Waveguiding in SAW Devices on Substrates with Anisotropic Slowness and Excitation," Proceedings of the IEEE International Ultrasonics Symposium (IUS), Sep. 20-23, 2009, pp. 1668-1671.

Omori, T., et al., "Suppression of Transverse Mode Responses in Ultra-Wideband SAW Resonators Fabricated on a Cu-Grating / 15° YX-LiNbO$_3$ Structure," IEEE Transactions on Ultrasonics, Ferroelectrics, and Frequency Control, vol. 54, No. 10, Oct. 2007, pp. 1943-1948.

Solal, M., et al., "Design Modeling and Visualization of Low Transverse Modes R-SPUDT Devices," IEEE Ultrasonics Symposium, Oct. 2-6, 2006, pp. 82-87.

Tanski, W., "GHz SAW Resonators," IEEE Ultrasonics Symposium, 1979, pp. 815-823.

* cited by examiner

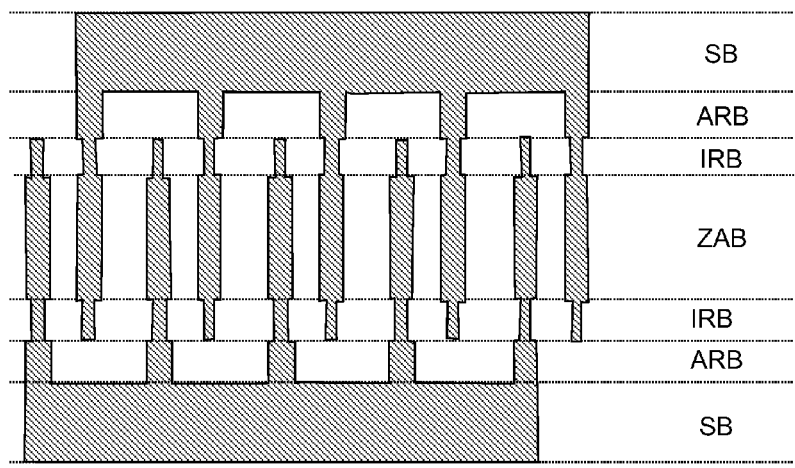
FIG 5
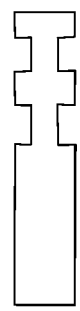 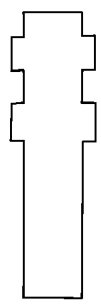 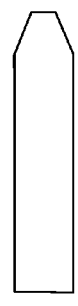 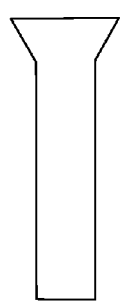
FIG 6   FIG 7   FIG 8a   FIG 8b
FIG 8c

SB
ARB
TG
IRB

IRB
TG
ARB
SB

IRB

FIG 15a    FIG 15b    FIG 15c
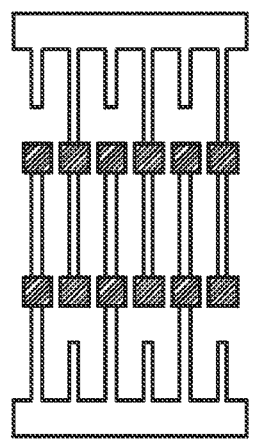
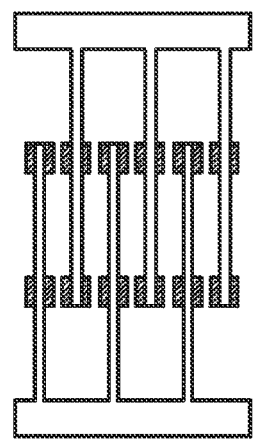
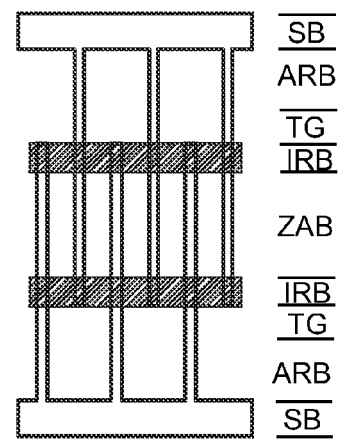
SB
ARB
TG
IRB
ZAB
IRB
TG
ARB
SB
FIG 15d
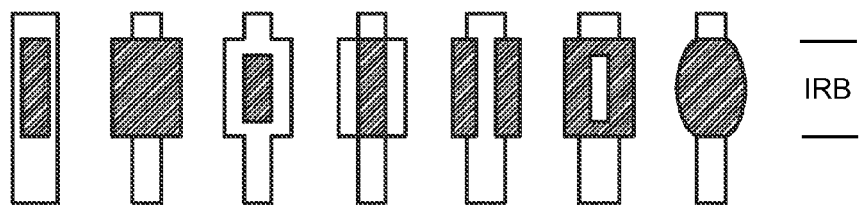
IRB

SB
ARB
TG
IRB
ZAB
IRB
TG
ARB
SB

FIG 17a
FIG 17b
FIG 17c
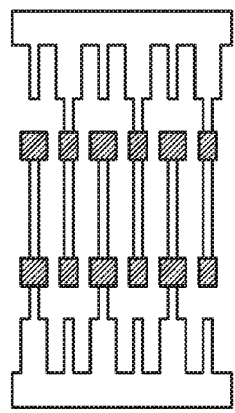
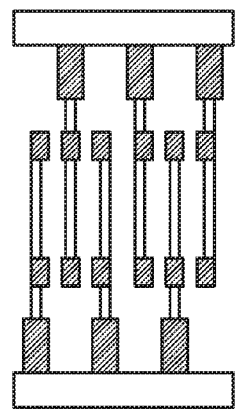
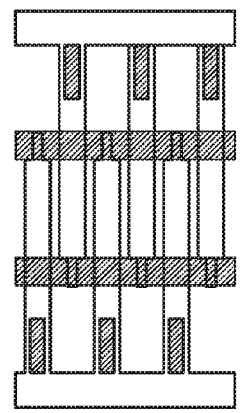
| SB |
| ARB |
| TG |
| IRB |
| ZAB |
| IRB |
| TG |
| ARB |
| SB |
FIG 17d
FIG 17e
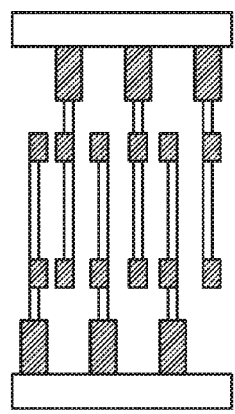
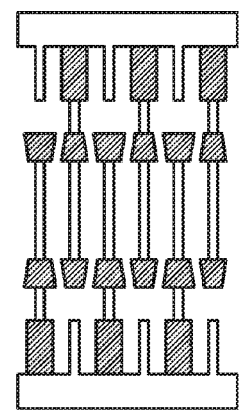
| SB |
| ARB |
| TG |
| IRB |
| ZAB |
| IRB |
| TG |
| ARB |
| SB |

FIG 18a
FIG 18b
FIG 18c
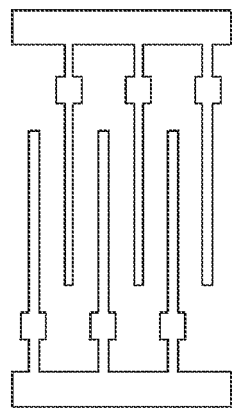
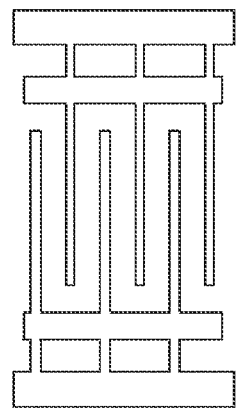
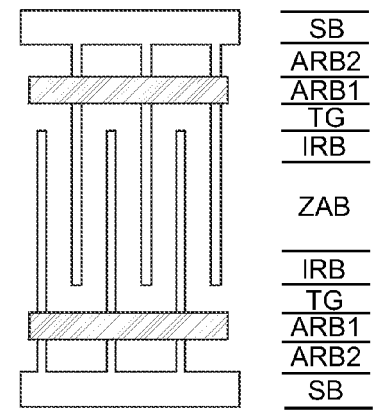
| SB |
| ARB2 |
| ARB1 |
| TG |
| IRB |
| ZAB |
| IRB |
| TG |
| ARB1 |
| ARB2 |
| SB |
FIG 18d
FIG 18e
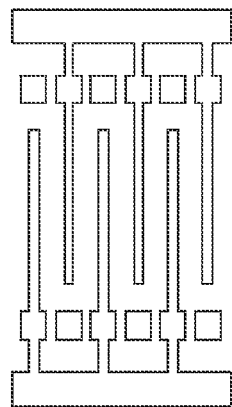
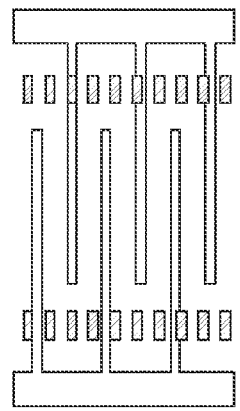
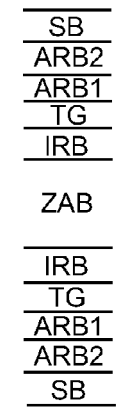
| SB |
| ARB2 |
| ARB1 |
| TG |
| IRB |
| ZAB |
| IRB |
| TG |
| ARB1 |
| ARB2 |
| SB |

SB
ARB2
ARB1
TG
IRB

ZAB

IRB
TG
ARB1
ARB2
SB

SB
ARB2
ARB1
TG
IRB

ZAB

IRB
TG
ARB1
ARB2
SB

FIG 20a
FIG 20b
FIG 20c
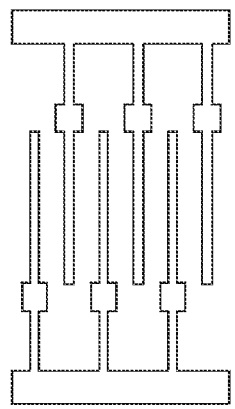
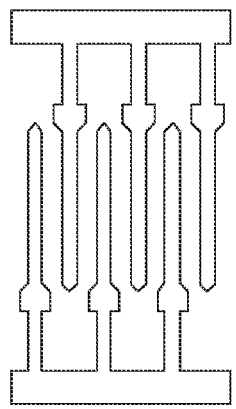
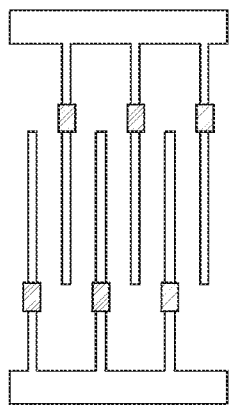
SB
ARB
TG
ZAB
TG
ARB
SB
FIG 20d
FIG 20e
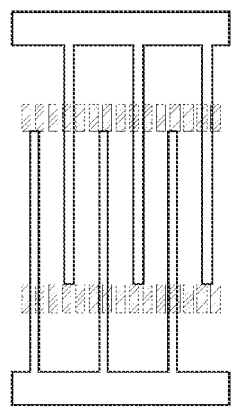
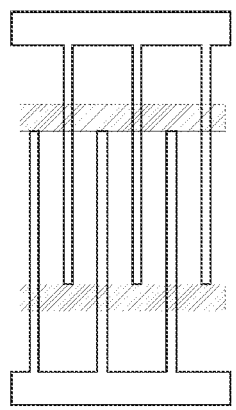
SB
ARB
TG
ZAB
TG
ARB
SB FIG 21a
FIG 21b
FIG 21c
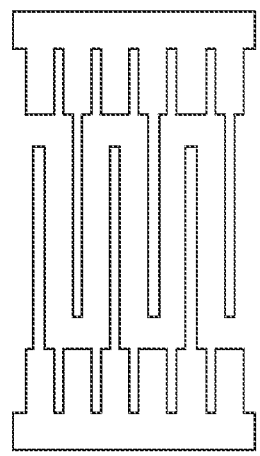
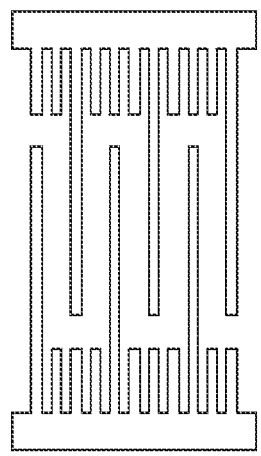
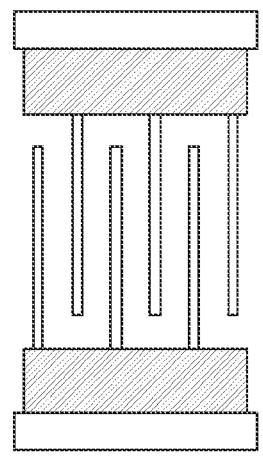
FIG 21d
FIG 21e
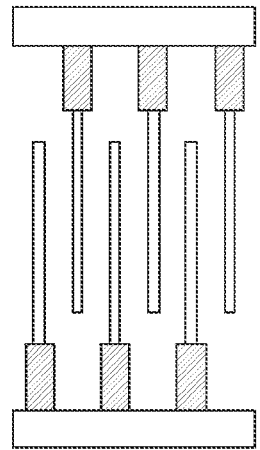
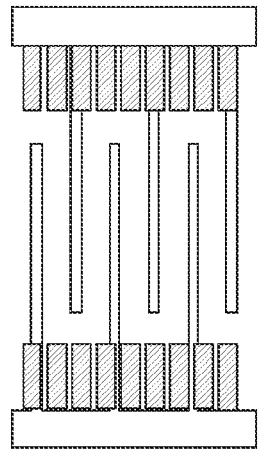

SB
ARB
TG
ZAB
TG
ARB
SB

ELECTROACOUSTIC TRANSDUCER HAVING REDUCED LOSSES DUE TO TRANSVERSE EMISSION AND IMPROVED PERFORMANCE DUE TO SUPPRESSION OF TRANSVERSE MODES

This patent application is a national phase filing under section 371 of PCT/EP2010/063562, filed Sep. 15, 2010, which claims the priority of German patent application 10 2010 005 596.4, filed Jan. 25, 2010, each of which is incorporated herein by reference in its entirety.

TECHNICAL FIELD

The invention relates to electroacoustic transducers which find application for example in a SAW or GBAW RF filter, and to methods for producing such transducers. Transducers according to the invention have lower losses due to a reduced transverse emission of acoustic waves and an improved performance due to suppression of transverse modes.

BACKGROUND

Components that operate with acoustic waves—e.g., surface acoustic waves (SAW) or guided bulk acoustic waves (GBAW)—convert RF signals into acoustic waves and conversely acoustic waves into RF signals. For this purpose, SAW or GBAW components comprise electrode fingers arranged on a piezoelectric substrate or on a piezoelectric layer. In a longitudinal direction, i.e., in the direction in which the acoustic waves propagate, electrode fingers are arranged alongside one another, which are generally connected alternately to a first and a second busbar. The acoustic track is that region of the substrate or of the piezoelectric layer in which surface acoustic waves propagate during the operation of the component. The electrode fingers lie in the acoustic track and thus in the acoustic region. The busbars lie in the lateral edge region of the acoustic track. In a longitudinal direction, the acoustic track is generally delimited by reflectors in order to reduce the energy loss due to emission of the acoustic waves in a longitudinal direction.

SUMMARY OF THE INVENTION

One loss mechanism in the case of components that operate with acoustic waves consists in acoustic waves leaving the acoustic track in a longitudinal or transverse direction.

In particular due to the finite aperture of the acoustic tracks, transverse acoustic modes can arise due to diffraction effects. Such modes disturb the transmission characteristic and constitute a loss mechanism. One important point in the development of components that operate with acoustic waves, in particular surface acoustic wave filters for mobile radio applications, is to obtain components having low loss mechanisms—e.g., without disturbing transverse modes or with reduced disturbing transverse modes—in conjunction with a good transmission characteristic.

The published German patent application DE 103 31 323 A1 discloses transducers which operate with SAWs and in which the losses due to transverse oscillations are reduced by cutouts being arranged in the busbars.

The U.S. Pat. No. 7,576,471 discloses components which operate with SAWs and in which the thickness of the electrode fingers is increased in a region between a central excitation region ("center region") and the region of the bulbar ("busbar region"). In this case, however, the application is restricted to so-called "weakly coupling" substrates. The electroacoustic coupling constant $k^2$ is a measure of the strength of the coupling between acoustic waves and RF signals.

Summary

In one aspect, the present invention specifies an electroacoustic transducer which has low transverse losses and which is compatible with strongly coupling piezoelectric substrates.

In a first embodiment, the invention specifies an electroacoustic transducer arranged in an acoustic track. The transducer comprises a piezoelectric substrate and two electrodes arranged thereon and each having interdigital electrode fingers interconnected with a bulbar, for the excitation of acoustic waves. The transducer is designed such that the acoustic wave in a plurality of regions running parallel to the acoustic track has a different longitudinal propagation velocity. The longitudinal propagation velocity is the velocity of the acoustic wave in a longitudinal direction.

The transducer comprises a central excitation region with a first longitudinal velocity. Inner edge regions flank the central excitation region on both sides, in which inner edge regions the longitudinal velocity deviates from the longitudinal velocity in the central excitation region. Outer edge regions flank the inner edge regions. In the outer edge regions the longitudinal velocity is higher than in the inner edge regions. The outer edge regions can serve for waveguiding. Their width is then large enough to achieve waveguiding—e.g., a decay of the bound modes to zero. Regions of the busbars flank the outer edge regions of the electroacoustic transducer. In the regions of the busbars of the electroacoustic transducer the longitudinal velocity is lower than in the outer edge regions. The substrate has a convex slowness. The slowness is the reciprocal of the velocity. The slowness is proportional to the wave vector k of the acoustic waves propagating in the substrate. The presence of a convex slowness is equivalent to an anisotropy factor $\Gamma$ of the substrate that is greater than $-1$: $\Gamma > -1$. In this case, the anisotropy factor is defined by the equation $$k_x^2 + (1+\Gamma)k_y^2 = k_0^2$$

where $k_x$ is the component of the wave vector in a longitudinal direction, $k_y$ is the component of the wave vector in a transverse direction, and $k_0$ is the wave number in the main propagation direction of the acoustic waves. The main propagation direction in a longitudinal direction x is given by the arrangement of the electrode fingers. The main propagation direction runs perpendicular to the electrode fingers. The abovementioned equation in this case holds true approximately for $k_y/k_x \ll 1$.

In one variant of the first embodiment, the longitudinal velocity is lower in the inner edge region than in the central excitation region.

In one embodiment, the longitudinal velocity in the region of the busbars is lower than the longitudinal velocity in the inner edge regions.

In one embodiment, the longitudinal velocity in the outer edge regions is higher than the longitudinal velocity in the central excitation region.

In another embodiment, the invention specifies an electroacoustic transducer arranged in an acoustic track. The transducer comprises a piezoelectric substrate and two electrodes arranged thereon and each having interdigital electrode fingers interconnected with a busbar, for the excitation of acoustic waves. The transducer is designed such that the acoustic wave in a plurality of regions running parallel to the acoustic track has a different longitudinal propagation velocity.

The transducer comprises a central excitation region with a first longitudinal velocity. Inner edge regions flank the central excitation region on both sides, in which inner edge regions the longitudinal velocity deviates from the longitudinal velocity in the central excitation region. Outer edge regions flank the inner edge regions. In the outer edge regions the longitudinal velocity is higher than in the central excitation region. Regions of the busbars flank the outer edge regions of the electroacoustic transducer. In the regions of the busbars of the electroacoustic transducer the longitudinal velocity is lower than in the outer edge regions.

The regions of the busbars are of a size such that wave guiding is possible in these regions. In contrast to the first variant, the region of the busbars serves for waveguiding.

The substrate has a concave slowness. The presence of a concave slowness is equivalent to an anisotropy factor Γ of the substrate that is less than −1: Γ<−1.

In one variant of the second embodiment, the longitudinal velocity is higher in the inner edge region than in the central excitation region.

In one embodiment, the longitudinal velocity in the outer edge regions is higher than the longitudinal velocity in the inner edge regions.

In one embodiment, the longitudinal velocity in the regions of the busbars is lower than the longitudinal velocity in the central excitation region.

Such configurations of an electroacoustic transducer in which the longitudinal velocity varies in a transverse direction produce a transverse profile of the longitudinal velocity in which a so-called "piston mode" is capable of propagation. The piston mode is an oscillation mode characterized by the fact that the profile of the maximum deflection of the atoms of the piezoelectric material is substantially constant within the excitation region and preferably zero in the region outside the acoustic track. In between, the maximum deflection decreases with a gradient as high as possible. Quantitatively, a "good" piston mode is characterized in that the overlap integral of the fundamental mode:

$$\int |\Phi(y)\Psi(y)| dy$$

formed from transverse excitation profile $\Phi(y)$ and transverse deflection profile $\Psi(y)$ is as large as possible. Another notation for this integral is: $<\Phi|\Psi>$.

The piston mode is furthermore characterized by the fact that no or at most minimal acoustic waves propagating in a transverse direction occur. Achieving the piston mode is therefore an effective means for reducing energy losses due to transverse emission of acoustic waves from the acoustic track and at the same time for achieving an improved performance due to suppression of transverse modes.

The transducer described above enables an improved piston mode compared with known transducer structures, i.e., an enlarged overlap integral of the fundamental mode. Furthermore, the transducer according to the invention is compatible with highly coupling substrates.

The setting of the longitudinal velocity in regions of the acoustic track which are arranged transversely alongside the central excitation region is essential for achieving a high value of the overlap integral.

The subdivision of the region of the acoustic track between the central excitation region and the region of the busbars into regions having a different longitudinal velocity makes it possible to obtain a piston mode with a flank region that can be set better. In particular, the gradient of the deflection function is increased.

In one embodiment, the busbar and the electrode fingers are arranged on a piezoelectric substrate having a higher electroacoustic coupling coefficient than quartz. By way of example, lithium tantalate or lithium niobate is appropriate as such a piezoelectric substrate.

The designation "concave" slowness relates to the ratio of $k_y$, the wave number in a transverse direction, to $k_x$, the wave number in a longitudinal direction. A concave slowness means that the slowness in a transverse direction, which is proportional to $k_y$, as a function of the slowness in a longitudinal direction, which is proportional to $k_x$, is a concave function: the second derivative of the slowness in a longitudinal direction with respect to the slowness in a transverse direction is positive. Alternatively the following equivalently holds true: the second derivative of $k_x$ with respect to $k_y$ is positive:

$$\left(\frac{d}{dk_y}\right)^2 k_x(k_y) > 0$$

A piezoelectric substrate having concave slowness has a focusing effect on acoustic waves and thereby helps to reduce the emission of acoustic waves in a transverse direction.

In one embodiment, the electrode fingers at least in sections along the transverse direction are wider within the inner edge regions than in the central excitation region.

In one embodiment, the electrode fingers at least in sections along the transverse direction are narrower within the inner edge regions than in the central excitation region.

The velocity of the acoustic waves at the surface of a piezoelectric substrate is dependent on the mass covering of the substrate, i.e., on the mass of the layers that are arranged on the substrate. Materials of the electrode fingers constitute such layers. In this case, an acoustic wave is all the slower, the higher the mass covering, and all the faster, the greater the elastic constants of the material of the mass covering. Widened electrode fingers generally constitute an increased mass covering. A finger widening restricted to the inner edge region is thus a simple but effective means for reducing the longitudinal velocity in the inner edge region. Depending on the material, a mass covering (e.g., with $Al_2O_3$ or diamond, both materials are relatively light but have high stiffness values) can also increase the velocity.

Likewise, a narrowing or widening of the electrode fingers can bring about a decrease or an increase in the velocities.

In one embodiment, the width of the electrode fingers at least in sections along the transverse direction changes linearly within the inner edge regions. The fact that the finger width changes linearly, i.e., not in a stepped fashion, provides a further degree of freedom in the shaping of the deflection profile and thus of the piston mode. In this case, the width can increase or decrease from the inner area outward.

In one embodiment, the electrode fingers at least in sections along the transverse direction are higher or lower within the inner edge regions than in the central excitation region. A thickening or thinning of the fingers likewise constitutes one possibility for altering the mass covering in order to obtain an improved piston mode.

In one embodiment, the electrode fingers are higher in the central excitation region than in the inner edge regions, the outer edge regions or the regions of the busbars and in this case have, in particular, a thicker metallization. A thickening and also a thinning, depending on material parameters, of the fingers likewise constitute one possibility for altering the mass covering. By setting the thickness of the fingers, the acoustic velocity can easily be set in order to obtain an improved piston mode.

In one embodiment, the height of the electrode fingers, i.e., the thickness of the electrode layer on the substrate, within the inner edge regions changes in a stepwise manner at least in sections along the transverse direction.

Electrode fingers and busbars are usually applied on a piezoelectric substrate in deposition processes (for example, using lift-off technology or using etching technology). In this case, a linear change in the thickness cannot be realized in a trivial manner. In the case of a stepwise change it is possible, if the step size is chosen to be small enough, to choose and obtain a good approximation to a linear profile.

In one configuration, the height of the electrode fingers within the inner edge regions increases linearly at least in sections along the transverse direction, i.e., outwardly or inwardly. If an approximation by a thickness changed in a stepped fashion is not sufficient, then a linearly or otherwise continuous function of the layer thickness can be obtained by virtue of the fact that, during the deposition process, the material jet has a spatially inhomogeneous flow rate and the deposition rate differs in different regions of the substrate. The gradient of the deposition rate is then a spatially continuous function.

In one embodiment, a conductive or dielectric material different than the electrode material is arranged on the electrode fingers in the inner edge regions at least in lateral sections. Such a material arranged on the electrode fingers furthermore makes it possible to set the velocity of the acoustic wave on account of the different mass covering.

In one embodiment of a transducer, dielectric material is arranged in the inner edge regions on and between the electrode fingers. It is possible as it were to lay a rail, e.g., structured by means of lift-off technology or by means of etching technology, in a longitudinal direction over the electrode fingers. As a result, the mass covering and thus the longitudinal velocity can easily be set.

In one embodiment, hafnium oxide or tantalum oxide is arranged on or between the electrode fingers.

Hafnium oxide and tantalum oxide are compounds having a high specific density and thus have a great influence on the change in the velocity of the acoustic wave. In addition, they are electrical insulators, such that different fingers having a different polarity are not short-circuited.

Hafnium or tantalum, i.e., the metals themselves, can also serve to reduce the velocity. For this purpose, they are arranged on the electrodes, the busbars, on stub fingers or the electrode fingers.

In this case, the propagation velocity can be set such that a focusing in the propagation direction occurs on account of the anisotropy.

In one embodiment, the longitudinal velocity is higher in the outer edge regions than in the central excitation region.

In one embodiment of the electroacoustic transducer, the longitudinal velocity is higher in the inner edge regions than in the regions of the busbars.

In one embodiment, the longitudinal velocity is identical in the two inner edge regions. The longitudinal velocity in the two outer edge regions is also identical in each case here. The longitudinal velocity is identical in the regions of the two busbars.

In one embodiment, the match of the excitation profile of the fundamental mode of the acoustic wave in a transverse direction or of the transducer and of the deflection profile of the acoustic wave in a transverse direction—the overlap integral—is as high as possible. The normalized overlap integral is preferably greater than 0.9 or greater than 0.95 or greater than 0.99. In this case, the normalized overlap integral is:

$$\frac{\langle \Phi | \Psi \rangle}{\sqrt{\langle \Phi | \Phi \rangle \langle \Psi | \Psi \rangle}} \leq 1.$$

In one embodiment, the transverse excitation profile of the fundamental mode of the acoustic wave is adapted to the transverse deflection profile by a phase weighting in the inner edge region. In this case, a phase weighting is obtained by individual regions, for example regions arranged in a transverse direction, of the electrode fingers having an excitation center—generally the center of the electrode fingers—which is displaced in a longitudinal direction relative to the excitation center in other regions. Such a displacement can be achieved by the widening or the narrowing of the electrode fingers not being implemented symmetrically with respect to the finger center in a longitudinal direction.

By means of a displacement of the excitation center of parts of the electrode fingers, what is achieved, on account of the mismatch with respect to the otherwise sharply defined orientation of the acoustic wave, its wavelength and the excitation center, is that the excitation intensity is reduced in these lateral regions. The developer of an electroacoustic transducer is thus provided with a further degree of freedom for setting the excitation profile and thus for setting a piston mode.

In one embodiment, the electrode fingers or the busbars are covered with a dielectric layer. In one configuration of this electroacoustic transducer, the layer consists of $SiO_2$. Silicon dioxide is furthermore well suited to compensating for the temperature response of the elastic components of the substrate.

In one embodiment, the electroacoustic transducer is a GBAW component. In a GBAW component, acoustic waves propagate at a boundary layer between a piezoelectric layer and a dielectric layer arranged thereon.

In one embodiment, the widths of the outer edge regions are determined by the lateral distance between the ends of the electrode fingers of one electrode and the other electrode, i.e., the busbar itself. In such an embodiment, the electroacoustic transducer has no stub fingers. Alternatively, stub fingers in the regions of the busbars are possible in order to suitably set the mass covering. Stub fingers are electrode fingers which do not overlap electrode fingers of the opposite electrode and therefore excite substantially no longitudinal acoustic waves.

The distance W, which corresponds to the distance between the central excitation region and the outer edge region in the case of convex slowness and to the distance between the central excitation region and the busbars in the case of concave slowness, can be $$W = \frac{v_{ZAB}}{2\pi f} |\sqrt{1+\Gamma}| \frac{\arctan\sqrt{\frac{\Delta v_{AB}}{\Delta v_{RB}}}}{\sqrt{2\frac{\Delta v_{RB}}{v_{ZAB}}}}$$

In this case, f is the operating frequency, $\Delta v_{AB} = |v_{ZAB} - v_{AB}|$, $\Delta v_{RB} = |v_{ZAB} - v_{RB}|$ and $v_{ZAB}$ is the velocity in the central excitation region.

In the case of a convex slowness, $v_{RB}$ is the longitudinal velocity in the inner edge region and $v_{AB}$ is the longitudinal velocity in the outer edge region.

In the case of a concave slowness, $v_{RB}$ is the velocity averaged over the inner edge region and the outer edge region. $v_{AB}$ is the velocity in the region of the busbar.

In one embodiment, the inner edge region is significantly wider (e.g., 2 times, 5 times or 10 times wider) than the outer edge region.

In the case of concave slowness, the width of the regions of the busbars can be greater than or equal to $$-\frac{\ln 0.1}{k_{yAB}}.$$

In this case, $k_{yAB}$ is:

$$k_{yAB} = \frac{2\pi f}{v_{ZAB}} \sqrt{\frac{2\Delta v_{AB}}{v_{ZAB}(1+\Gamma)}}.$$

In the case of convex slowness, the width of the outer edge regions can be greater than or equal to $$-\frac{\ln 0.1}{k_{yAB}}.$$

In this case, $k_{yAB}$ is:

$$k_{yAB} = \frac{2\pi f}{v_{ZAB}} \sqrt{\frac{2\Delta v_{RB}}{v_{ZAB}(1+\Gamma)}}.$$

In one embodiment, the widths of the outer edge regions are determined by the lateral distance between the ends of the electrode fingers of one electrode and the ends of stub fingers interconnected with the busbar of the other electrode.

In one embodiment, the electroacoustic transducer is part of a resonator that operates with acoustic waves, having reflectors that delimit the acoustic track in a longitudinal direction.

In a longitudinal direction, further electroacoustic transducers can also arrange between reflectors delimiting the acoustic track. In this case, one or more transducers can be input transducers which convert RF signals into acoustic waves, while one or more other transducers are output transducers which convert acoustic waves into RF signals.

In one embodiment, a resonator that operates with acoustic waves comprises reflectors which delimit the acoustic track in a longitudinal direction. In this case, at least one of the reflectors has the same transverse velocity profile of the acoustic wave as the transducer.

In one embodiment, the transducer is arranged together with a reflector on a piezoelectric substrate, wherein the reflector has reflector fingers having the same construction as the electrode fingers of the transducer in a transverse direction.

In one embodiment, the invention specifies an electroacoustic transducer arranged in an acoustic track. The transducer comprises a piezoelectric substrate and two electrodes arranged thereon and each having interdigital electrode fingers interconnected with a busbar, for the excitation of acoustic waves. The transducer is designed such that the acoustic wave in a plurality of regions running parallel to the acoustic track has a different longitudinal propagation velocity. The longitudinal propagation velocity is the velocity of the acoustic wave in a longitudinal direction.

The transducer comprises a central excitation region with a first longitudinal velocity. Outer edge regions flank the central excitation region. The velocity of the acoustic waves in the outer edge regions generally deviates from the longitudinal velocity in the central excitation region. Regions of the busbars flank the outer edge regions of the electroacoustic transducer. The longitudinal velocity is lower in the regions of the busbars of the electroacoustic transducer than in the outer edge regions. The substrate with electrode structures has a self-focusing slowness. The presence of a self-focusing slowness is equivalent to an anisotropy factor $\Gamma$ of the substrate which is substantially equal to $-1$: $\Gamma=-1$.

Further features with which transducers operating with acoustic waves with improved mode generation can be obtained are specified below.

A corresponding transducer comprises a central excitation region, if appropriate inner edge regions flanking the central excitation region, if appropriate gap regions flanking the inner edge regions, if appropriate outer edge regions flanking the gap regions, and regions of the busbars which flank the gap regions or outer edge regions, if present. The gap regions can be characterized in that in them electrode fingers of at least one electrode are interrupted.

The longitudinal propagation velocities of the acoustic waves propagating in the transducer are set suitably in the different regions in order to be able to obtain, in particular, a piston mode. For this purpose, it is possible to optimally set, for example, the mass covering per wavelength $\lambda$, in inner edge regions, in gap regions, in outer edge regions or in regions of the busbars. The setting of the mass covering is possible in the case of substrates having convex slowness ($\Gamma>-1$), concave slowness ($\Gamma<-1$) or in the case of an anisotropy factor of $\Gamma=-1$. As a result, as far as possible the entire acoustic energy is utilized for the excitation of exclusively the desired fundamental mode, e.g., of the piston mode. As a consequence, this results in reduced dips in the filter transfer function of corresponding filter components and in reduced shear loads on the electrode fingers as a result of higher modes, as a result of which the performance of the device is improved.

In particular, in the case of substrates having convex slowness it is possible to increase the mass covering in the inner edge regions, and in the case of substrates having concave slowness it is possible to increase the mass covering in gap regions explained in greater detail below.

In the case of substrates having concave slowness it is also possible to increase the mass coverings in the outer edge regions and in the central excitation region.

In the case of substrates having concave slowness it is also possible to decrease the mass coverings in the inner edge regions, at least from a relative standpoint.

An increase in the mass covering can be achieved by one of the following measures:

Widening the fingers, i.e., locally increasing the metallization ratio $\eta$,

Increasing the finger thickness by applying a preferably heavier element, for example a metal or a dielectric, in the form of a weighting layer above the electrode layer, below the electrode layer or between layers of electrode layers configured in multilayered fashion, Applying a continuous dielectric strip, here arranged parallel to the wave propagation direction, as weighting layer, Applying a continuous strip composed of metal or a dielectric as weighting layer on a dielectric cover layer, Reducing the mass covering in the remainder of the acoustic track, for example by selectively removing a dielectric cover layer or a weighting layer. In this case, a selective removal leads to a relative increase in the mass loading in those regions in which removal is not effected.

A, for example relative, decrease in the mass covering can be achieved by one of the following measures:

Reducing η, e.g., by reducing the finger width,

Increasing the mass covering in the rest of the acoustic track by one of the measures described above.

In the case of a substrate having convex slowness it is possible to increase the mass covering in inner edge regions. The inner edge regions can have a width of 0.1 to 3.0 in units of the wavelength λ of the longitudinal waves. The widths of the inner edge regions can be, in particular, between 0.25 and 1.0λ. The metallization ratio, η, in inner edge regions can be 0.9 or less η can vary over the inner edge regions.

Heavy metals, such as, for example, copper, gold, silver, platinum, tungsten, tantalum, palladium or molybdenum, or a heavy dielectric, such as, for example, tantalum oxide, for example $Ta_2O_5$, can be arranged in a weighting layer in the inner edge regions, for example on the electrode fingers. The layer thickness of such a weighting layer can be between 5% and 200% of the thickness of an electrode finger. Such a weighting layer can comprise one or more layer plies composed of individual elements or composed of an alloy. One or more adhesion layers for a better mechanical connection between the component and a weighting layer can comprise titanium. Such a weighting layer can also be arranged below the electrode fingers.

Such a weighting layer can, in particular, be arranged above the electrode fingers and consist of the same material as the electrode fingers. The thickness of such a weighting layer can be, in particular, 10% to 50% of the finger thickness.

The weighting layer can comprise a dielectric and cover the entire inner edge region. By means of a dielectric, the electrode fingers are not short-circuited. Such a weighting layer composed of $Ta_2O_5$ can have, for example, a layer thickness of 5% to 200% of the electrode finger thickness.

Above the electrode fingers, a dielectric insulation layer can be arranged in the inner edge regions. A weighting layer having a thickness of 10 nm to 1 μm can be arranged thereabove in the entire inner edge region.

Alternatively or as an additional measure, in all other regions outside the inner edge regions a dielectric layer, for example a compensation layer composed of $SiO_2$, can be thinned, but at most to a thickness of 10% of the thickness in the inner edge regions.

The gap regions of a transducer can be a width of between 0.5 and 5.0λ. Outer edge regions flanking the gap regions can comprise stub fingers interconnected with the corresponding busbar. Such an outer edge region can in each case have a width of 1.0 to 5.0λ.

The width of the gap regions can be, in particular, 0.5 to 5.0λ. The outer edge regions can then be free of stub fingers.

The metallization ratio η can be 0.9 or less in the outer edge regions. In the case of such a high metallization ratio η, the ohmic losses of the electrode fingers are reduced.

The electrode fingers in the outer edge regions can be thickened by a weighting layer, which, for example, is a layer thickness of 5% to 200% in units of the finger thickness.

The electroacoustic excitation in inner edge regions can be reduced, for example, by phase weighting. For this purpose, the excitation centers, the centers between finger edges of adjacent fingers, can be displaced in a longitudinal direction. The displacement can be periodic or random. The displacement of the finger centers can be 0.25 in units of λ or less.

By suitably setting the electroacoustic excitation, it is possible to obtain an improved profile of the piston mode. For this purpose, the metallization ratio η can also be adapted periodically or in a randomly distributed manner η can be varied, for example, in a range of 0.1 to 0.9.

It is also possible to suitably set the mass covering in the outer edge regions. For this purpose, by way of example, the outer edge regions can comprise partial regions arranged alongside one another as seen in a longitudinal or transverse direction. Stub fingers can be arranged in an outer partial region of the outer edge regions. Inner partial regions of the outer edge regions which have no stub fingers can be arranged between the outer partial regions of the outer edge regions. The width of the gap regions can be between 0.1 and 1λ. The width of the inner partial regions of the outer excitation regions can be between 0.1 and 3.0λ and the width of the outer partial regions of the outer edge regions can be between 1.0λ and 5.0λ. In order to increase the mass covering in the outer edge regions, η can be increased to up to 0.9.

In general, the measures for increasing or for decreasing the velocity in one region with a set velocity can also contribute to increasing or to decreasing the velocity in other regions with a set velocity.

Outer edge regions, gap regions and inner edge regions arranged alongside one another can have a total width of 0.1λ to 3.0λ.

It is possible to increase only the mass covering in the gap region. The previous measures for increasing the mass covering in the inner edge regions or in the outer edge regions can be used as measures for increasing the mass covering in the gap region.

As substrates for components that operate with acoustic waves with an improved piston mode it is possible to employ piezoelectric substrates such as lithium niobate $LiNbO_3$, for short: LN, or lithium tantalate $LiTaO_3$, for short: LT.

Specifically, the substrates in the following table are possible, inter alia:

| Abbreviation | Material | Euler angles |
|---|---|---|
| LN 128 Y-X | $LiNbO_3$ | (0°, 37.85°, 0°) |
| LN Y-X | $LiNbO_3$ | (0°, −90.0°, 0°) |
| LN 10 RY | $LiNbO_3$ | (0°, −80.0°, 0°) |
| LN 15 RY | $LiNbO_3$ | (0°, −75.0°, 0°) |
| LN Y-Z | $LiNbO_3$ | (0°, −90.0°, −90.0°) |
| LT 36 Y-X | $LiTaO_3$ | (0°, −54.0°, 0°) |
| LT 39 Y-X | $LiTaO_3$ | (0°, −51.0°, 0°) |
| LT 42 Y-X | $LiTaO_3$ | (0°, −48.0°, 0°) |
| Quartz 32 | $SiO_2$ (α-quartz) | (0°, 122.0°, 0°) |
| Quartz 36 | $SiO_2$ (α-quartz) | (0°, 126.0°, 0°) |
| Quartz 37.5 | $SiO_2$ (α-quartz) | (0°, 127.5°, 0°) |
| Quartz 39.5 | $SiO_2$ (α-quartz) | (0°, 129.5°, 0°) |

Substrates having a deviation from the specified angles of up to a few tenths of a degree are also suitable.

In this case, the Euler angles are defined as follows: a set of axes x, y, z, which are the crystallographic axes of the substrate, are firstly taken as a basis.

The first angle, λ, specifies the amount by which the x-axis and the y-axis are rotated about the z-axis, the x-axis being rotated in the direction of the y-axis. A new set of axes x', y', z' accordingly arises, where z=z'.

In a further rotation, the z'-axis and the y'-axis are rotated about the x'-axis by the angle μ. In this case, the y'-axis is rotated in the direction of the z'-axis. A new set of axes x", y", z" accordingly arises, where x'=x".

In a third rotation, the x"-axis and the y"-axis are rotated about the z"-axis by the angle θ. In this case, the x"-axis is rotated in the direction of the y"-axis. A third set of axes x''', y''', z''' thus arises, where z"=z'''.

In this case, the x'''-axis and the y'''-axis are parallel to the surface of the substrate. The z'''-axis is the normal to the surface of the substrate. The x'''-axis specifies the propagation direction of the acoustic waves.

The definition is in accordance with the international standard IEC 62276, 2005-05, Annex A1.

By way of example, $LiNbO_3$ having the Euler angles ($\lambda=0°$, $\mu=-75\pm15°$, $\theta=0°$) is appropriate as GBAW or boundary acoustic wave components.

A transducer can comprise a metal having a higher density than aluminum, for example copper, gold, tungsten or an alloy of these metals, as main constituent.

Electrodes or the electrode fingers of a transducer can consist of a metal having a higher density than aluminum, for example copper, gold, tungsten or an alloy of these metals, as main constituent.

A compensation layer can be arranged on a transducer. A compensation layer can reduce or eliminate the temperature response of the frequency position of a component. Such a compensation layer can comprise $SiO_2$, $SiO$, $Al_2O_3$ or $SiO_xN_y$. The thickness of such a compensation layer can be greater than or equal to 50% in units of $\lambda$.

By way of example, lithium niobate having a set of Euler angles of ($\lambda=0°$, $\mu=-90\pm3°$, $\theta=0°$) is appropriate as an SAW substrate.

Electrodes can comprise a plurality of layers of individual elements or of different alloys. In particular, adhesion layers or barrier layers, which can reduce acoustomigration, can comprise titanium, titanium oxide or titanium nitride.

The total height of an electrode can be 4% to 7% in units of $\lambda$. The metallization ratio averaged over all edge regions and the central excitation region can be between 0.55 and 0.7; the finger period, which substantially determines the frequency response of the component, can be in the range of between 0.8 and 1.1 µm.

A compensation layer comprising planarized $SiO_2$ can comprise a thickness of between 25% and 33% in units of $\lambda$.

A dielectric passivation or trimming layer can comprise silicon nitride. Such a passivation or trimming layer can comprise a thickness of less than 7% of the wavelength.

The angles (0°, 37.85±3°, 0°) are also appropriate as Euler angles for a piezoelectric lithium niobate substrate.

The total height of the electrodes can be between 6% and 8% in units of $\lambda$. The metallization ratio can be set to be between 0.5 and 0.65. The finger period can be between 1.8 and 2.1 µm.

The electrodes can be covered with a planar dielectric layer, e.g., comprising $SiO_2$. The thickness thereof can be between 29% and 33% of the acoustic wavelength $\lambda$.

The electrodes or a dielectric layer arranged thereabove can be covered with an additional dielectric passivation or trimming layer comprising e.g., $Si_3N_4$ or $SiO_2$. The thickness thereof can be up to 5% of the acoustic wavelength $\lambda$.

For one embodiment, lithium niobate substrates having the Euler angles (0°, 37.85±3°, 0°) are also appropriate.

The total height of the electrode can be between 6% and 12% of the wavelength. The metallization ratio can be between 0.5 and 0.58.

A corresponding transducer can be part of a duplexer for the WCDMA band II (1850-1990 MHz) and band III (1710-1880 MHz). For this purpose, the finger period defining the operating frequencies can be between 0.8-1.1 µm.

A compensation layer comprising silicon dioxide can have a thickness of between 30 and 50% $\lambda$.

A dielectric passivation or trimming layer can comprise silicon nitride and comprise a thickness of less than 7% in units of $\lambda$.

In one embodiment, the inner edge regions can be omitted and a good piston mode can nevertheless be obtained. For this purpose, transducers can comprise outer edge regions and gap regions as an alternative to inner edge regions. The number of regions having a set velocity is therefore not reduced. The gap regions can have a width of between 0.1 and 3.0$\lambda$. The outer edge regions can have a width of between 1.0 and 5.0$\lambda$.

In order to increase the metallization ratio, it is possible to increase the number of fingers per wavelength.

A dielectric weighting layer or a weighting layer composed of metal can have a thickness of 10 nm to 1 µm.

In one embodiment of a transducer, the mass covering is reduced in the inner edge regions in comparison with the outer edge regions or the gap regions. The total width of the inner edge regions and of the gap regions can be between 0.1 and 3.0$\lambda$.

A reduction of the mass covering can be achieved by a reduction of for example to values of greater than or equal to 0.1. A reduction of the mass covering can also be achieved by removing a dielectric cover layer to thicknesses of less than 1 µm.

Lithium tantalate having Euler angles of (0°, $-48\pm7°$, 0°) is appropriate as the substrate. Euler angles of (0°, $52\leq\mu\leq-35°$, 0°) are also possible.

The total height of the electrode fingers can be between 2.5 and 12% in units of $\lambda$. The metallization ratio $\eta$ can be between 0.4 and 0.8. The finger period can be between 0.7 and 3.0 µm.

A transducer can comprise a dielectric passivation layer, comprising silicon nitride, for example, having a thickness of less than 2% of the wavelength.

The aperture of the acoustic track can have a width of between 10$\lambda$ and 50$\lambda$. In particular, the aperture can be less than 20$\lambda$.

The width of the aperture and the width of the central excitation region, of the inner edge regions, of the gap regions, of the outer edge regions or of the regions of the busbars can be different for series resonators and parallel resonators and depend on the resonant frequency and the aperture. In particular, the mass coverings of different resonators can be configured differently.

A method for producing an electroacoustic transducer according to the invention comprises the steps of
providing a piezoelectric substrate,
structuring busbars and electrode fingers on the substrate,
removing electrode finger material in the central excitation region.

One embodiment of the method comprises the steps of
providing a piezoelectric substrate,
structuring busbars and electrode fingers on the substrate,
oxidizing the electrode finger material in the inner edge region.

The setting of the longitudinal velocities in transverse regions can be achieved by means of suitable material covering in the transverse regions. In this case, the velocity of acoustic waves is generally reduced by an increase in the mass on the substrate. The velocity is generally increased by a covering with material having high stiffness (e.g., $Al_2O_3$ or diamond). The choice of a suitable material of the mass covering therefore makes it possible both to increase and to decrease the velocity of the acoustic wave.

BRIEF DESCRIPTION OF THE DRAWINGS

Electroacoustic transducers according to the invention are explained in greater detail below on the basis of exemplary embodiments and associated schematic figures.

FIG. 5 shows a schematic illustration of an alternative embodiment, FIG. 6 shows a configuration according to the invention of an electrode finger, FIG. 7 shows a further schematic illustration of an electrode finger according to the invention, FIGS. 8A, 8B show further schematic illustrations of an electrode finger, FIG. 8C shows the cross section of an electrode finger with local thickenings.

DETAILED DESCRIPTION OF ILLUSTRATIVE EMBODIMENTS

Figure 1:
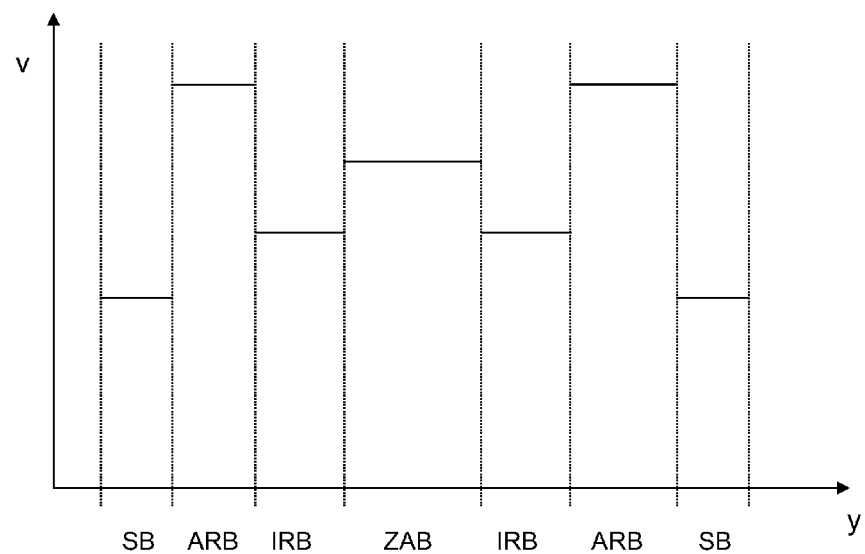
FIG. 1 shows a transverse velocity profile in which the longitudinal velocity is lower in the inner edge region than in the central excitation region.

FIG. 1 shows a velocity profile of the longitudinal velocity of regions of the acoustic track which are arranged alongside one another in a transverse direction. The central excitation region ZAB is arranged in the interior of the acoustic track. The inner edge regions IRB flank the central excitation region ZAB, said inner edge regions being arranged directly alongside the central excitation region ZAB. In this case, the longitudinal velocities of the inner edge regions IRB are lower than the longitudinal velocity in the central excitation region ZAB. The inner edge regions IRB in turn are flanked by the outer edge regions ARB. In this case, the longitudinal velocity of the outer edge regions ARB is higher than the longitudinal velocity of the inner edge regions IRB. It can also be higher than the longitudinal velocity of the central excitation region ZAB. The outer edge regions ARB in turn are flanked by the regions of the busbars SB, in which the longitudinal velocity of the acoustic waves is lower than in the outer edge regions ARB.

Figure 2:
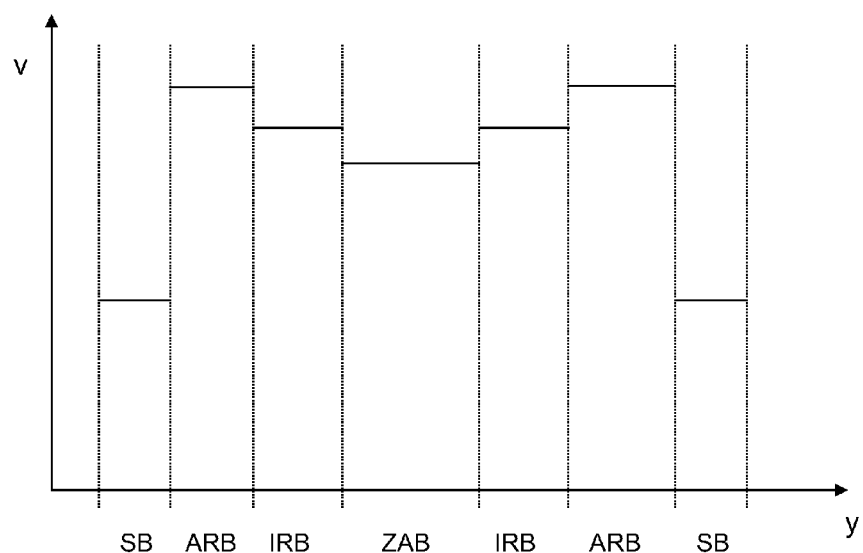
FIG. 2 shows a transverse velocity profile in which the longitudinal velocity is higher in the inner edge region than in the central excitation region.

FIG. 2 shows a profile along the transverse direction in which the longitudinal propagation velocities of the different regions are plotted. The difference with respect to the configuration shown in FIG. 1 consists in the fact that the longitudinal velocity in the inner edge regions IRB is higher than the longitudinal velocity in the central excitation region ZAB. The longitudinal velocities in the central excitation region ZAB and in the inner edge regions IRB are lower, however, than in the outer edge regions ARB flanking the inner edge regions.

Figure 3:
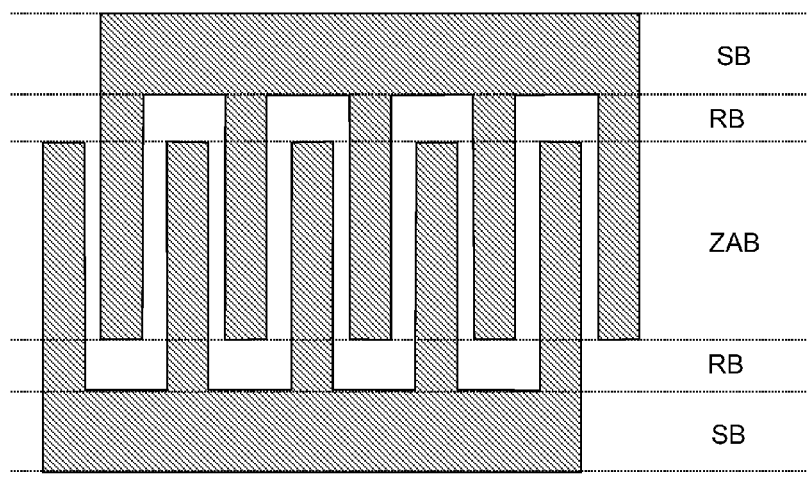
FIG. 3 shows a schematic illustration of a conventional electroacoustic transducer.

FIG. 3 illustrates a conventional electroacoustic transducer, in which, in an excitation region AB, in which electrode fingers of two different electrodes overlap, a conversion takes place between RF signals, on the one hand, and acoustic waves, on the other hand. The electrode fingers of an electrode must not touch the busbar of the other polarity, otherwise the transducer structure would be short-circuited. Therefore, an edge region RB, in which no electroacoustic conversion takes place, exists between the finger ends and the opposite busbar. Therefore, conventional transducers generally have only one edge region RB per side between the region of the busbar SB and the central excitation region AB.

Figure 4:
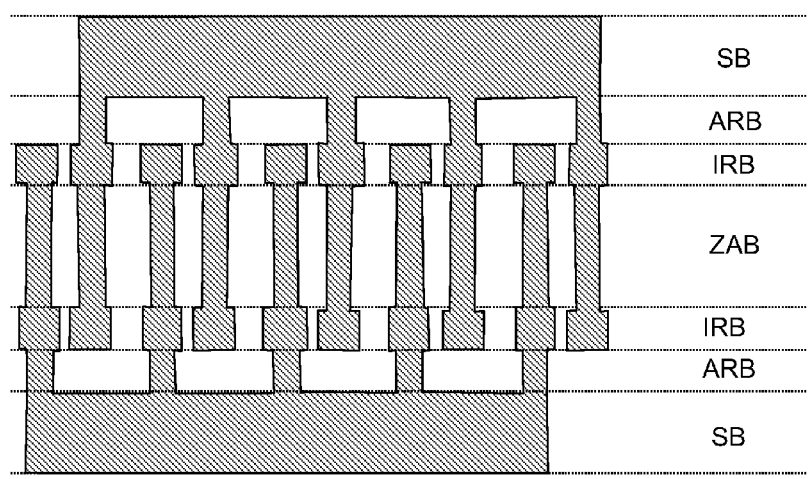
FIG. 4 shows a schematic illustration of a transducer according to the invention.

In contrast thereto, FIG. 4 shows an embodiment according to the present invention. In the central excitation region ZAB, the electrode fingers arranged in a comb-like manner convert between RF signals, on the one hand, and acoustic waves, on the other hand. Inner edge regions IRB flank the central excitation region ZAB. The electrode fingers are made wider in the inner edge region IRB, compared with the central excitation region ZAB. In the inner edge region IRB, too, a conversion takes place between RF signals and acoustic oscillations. As a result of the increased mass covering, for example on account of the increased finger thickness, the longitudinal velocity is reduced in the inner edge region IRB by comparison with the central excitation region ZAB.

Outer edge regions ARB flank the inner edge regions IRB. The outer edge regions ARB do not actively participate in the conversion between RF signals and acoustic waves. However, acoustic waves are indeed capable of propagation in the outer edge regions ARB. On account of the reduced mass covering in the outer edge regions ARB, the longitudinal velocity in the outer edge regions ARB is increased compared with the longitudinal velocities of the inner edge regions, of the reflectors IRB and of the central excitation region ZAB.

The regions of the busbars SB in turn flank the outer excitation regions. The mass covering is maximal here, compared with the rest of the transverse regions; the longitudinal velocity is minimal.

The arising of transverse oscillation modes is a consequence of diffraction effects within the acoustic track having a finite width. The formation of a transverse profile according to the invention of the longitudinal velocity (piston mode)

helps to reduce the arising of oscillation modes having a velocity in a transverse direction.

FIG. 5 shows an alternative embodiment, which differs from the embodiment in FIG. 4 to the effect that the width of the electrode fingers is reduced in the inner edge regions IRB, compared with the finger width of the central excitation region ZAB. As a result, the longitudinal velocity in the inner edge regions IRB is increased relative to the velocity of the central excitation region ZAB. The inner edge region IRB is counted as part of the excitation region because electrode fingers of different polarities overlap in it.

FIGS. 6, 7, 8a and 8b show possibilities for the configuration of electrode fingers in which the width of the fingers is reduced (FIG. 6) or increased (FIG. 7) in sections or in which the width of the electrode fingers decreases or increases linearly toward the finger end (FIGS. 8a and 8b).

Figure 8D:
FIG. 8D shows the cross section of an electrode finger with local thickenings increasing linearly.

FIG. 8c shows the cross section parallel to the transverse direction through an electrode finger EF having local thickenings LA. FIG. 8d shows the cross section parallel to the transverse direction through an electrode finger EF having linearly increasing local thickenings LA. Suitable thickenings enable the mass covering and, if appropriate, the elastic parameters of the electrode finger to be set such that the desired velocity profile is obtained.

Figure 9:
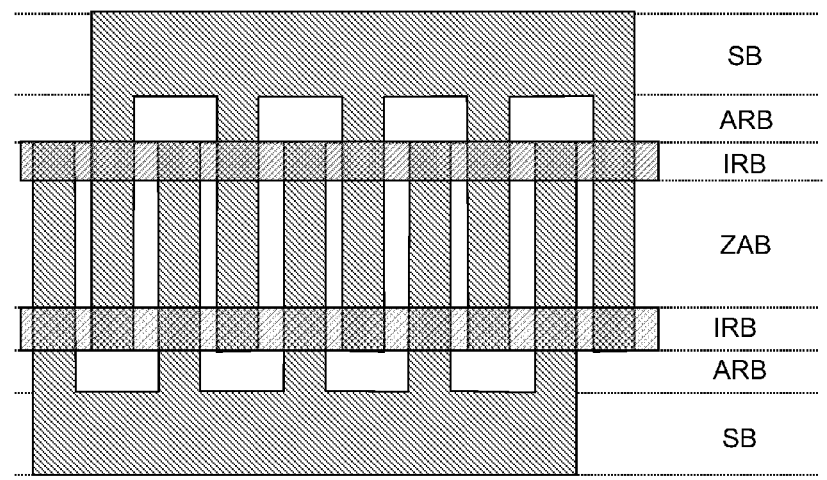
FIG. 9 shows a configuration of a transducer according to the invention with material deposited in rail-type fashion on the inner edge regions.

FIG. 9 illustrates a configuration in which, in inner edge regions IRB flanking the central excitation region ZAB, dielectric material is arranged on the electrodes and the regions of the substrate between the finger electrodes. As a result, the longitudinal velocity is reduced in the inner edge regions IRB.

Figure 10:
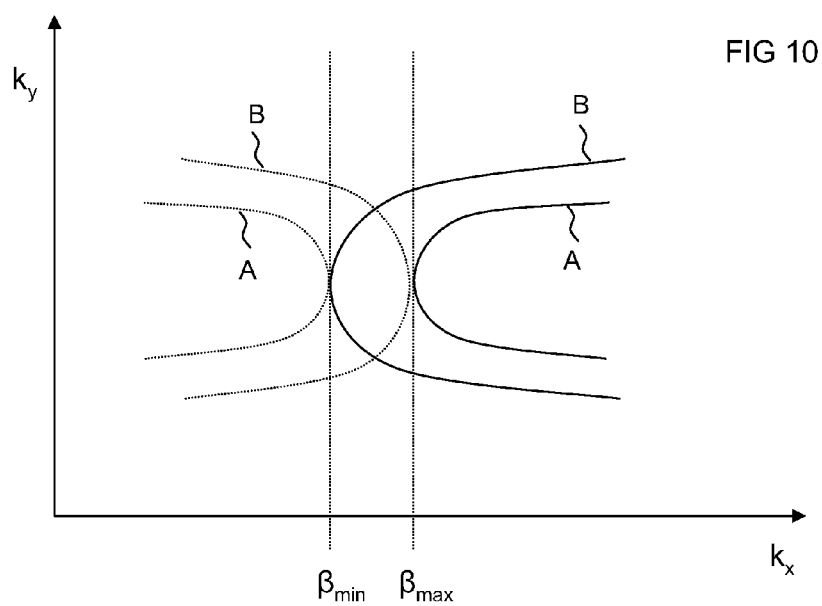
FIG. 10 shows the illustration of the dependence of $k_y$ as a function of $k_x$ in the case of a substrate having concave slowness.

FIG. 10 illustrates the relations between transverse and longitudinal wave numbers of the imaginary branch (dashed lines) and of the real branch (solid lines) for a concave slowness. In this case, $\beta_{min}$ designates the smallest possible value of the values of $k_x$ for which guided oscillation modes can exist. $\beta_{max}$ designates the largest possible value of the values of $k_x$ for which guided oscillation modes can exist. The curves A denote the wave vectors in the excitation region of the acoustic track; the curves B denote the wave vectors in the outer region, i.e., outside the acoustic track e.g., in the region of the busbars.

Figure 11:
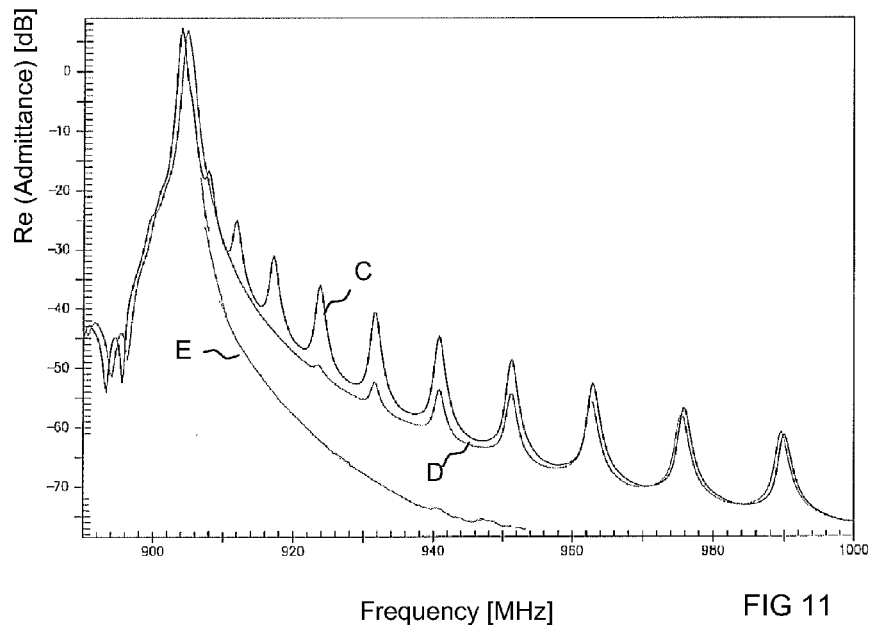
FIG. 11 shows the admittance of an electroacoustic resonator according to the invention.

FIG. 11 shows the real parts of three frequency dependent admittance profiles C, D, E in the case of convex slowness. Curve C shows the admittance of a conventional transducer having resonances at frequencies higher than the resonant frequency of the fundamental mode.

Curve D shows the admittance profile of an electroacoustic transducer in which the longitudinal velocities in the central excitation region, in inner edge regions, in outer edge regions and in the regions of the busbars are adapted for achieving a piston mode. Resonances occur at the same frequencies as in curve C; however, their amplitudes increase greatly only starting from approximately 25 MHz above the resonant frequency.

Curve E shows the calculated frequency-dependent admittance of an electroacoustic transducer whose longitudinal velocities in a central excitation region, in inner and outer edge regions and in regions of the busbar are adapted to a piston mode and in which the dispersion due to the anisotropy of $\Gamma = -1$ is excluded.

Figure 12:
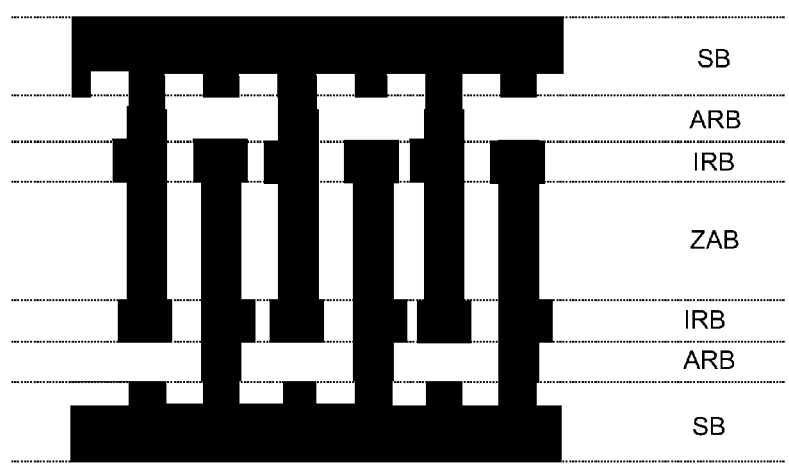
FIG. 12 shows the principle of phase weighting.

FIG. 12 shows the principle of phase weighting on the basis of widening of the electrode fingers. The widenings in the inner edge regions IRB, which are not arranged at the finger ends, are not arranged symmetrically with respect to an axis running through the center of the fingers in a transverse direction. Rather, the widenings are displaced in a longitudinal direction relative to the respective center of the finger. By virtue of the fact that the center is displaced, the center between the finger edges is no longer exactly "in phase" with the acoustic wave, as a result of which the excitation intensity $\Phi$ is reduced and adapted to the ideal flank of the deflection $\Psi$ of the piston mode.

A further option for adapting the acoustic wave is so-called stub or dummy fingers which are arranged in the region of the busbars and are substantially opposite the ends of the electrode fingers of the respective other polarity.

Figure 13:
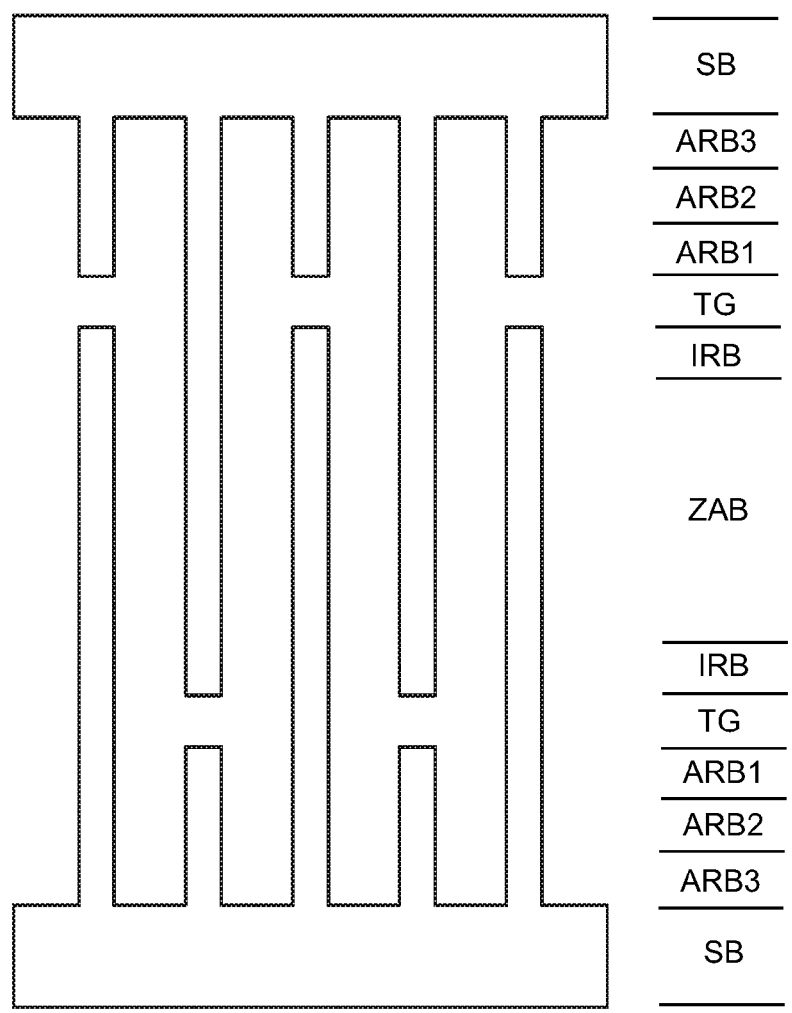
FIG. 13 shows a transducer having different partial regions of the outer excitation regions, FIGS. 14A, B show a transducer having different longitudinal regions and different geometrical embodiments of an inner edge region, FIGS. 15A, B, C, D, show different transducers having different longitudinal regions and different embodiments of an inner edge region, FIGS. 16A, B, C, show different embodiments of transducers having different longitudinal regions, FIGS. 17A, B, C, D, E, show different embodiments of transducers having different longitudinal regions, FIGS. 18A, B, C, D, E, show different embodiments of transducers having different longitudinal regions, FIGS. 19A, B, C, D, E, F, show different embodiments of transducers having different longitudinal regions, FIGS. 20A, B, C, D, E, show different embodiments of transducers having different longitudinal regions, FIGS. 21A, B, C, D, E, show different embodiments of transducers having different longitudinal regions, FIGS. 22A, B, C, show different embodiments of transducers having different longitudinal regions.

FIG. 13 shows an embodiment of a transducer, wherein gap regions TG (TG=Transversal Gap) flank inner edge regions IRB. Outer edge regions flank the gap regions TG. The outer edge regions are themselves subdivided into different partial regions ARB1, ARB2, ARB3. The partial regions of the outer edge region themselves are in turn flanked by regions of the busbar SB. The longitudinal propagation velocity of a desired mode can be set in the different longitudinal regions in order to obtain a well-defined piston mode.

Figure 14A:
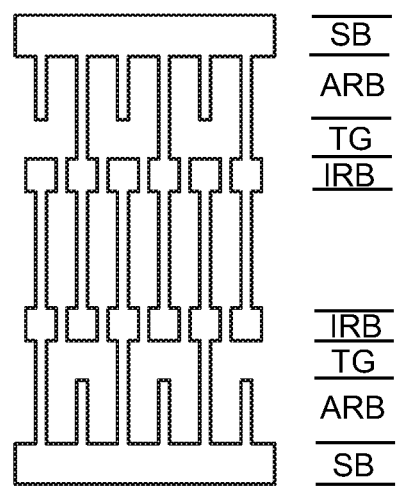

FIG. 14A shows a configuration of a transducer, wherein a respective gap region TG is arranged between the inner edge regions and the outer edge regions. In this exemplary embodiment, the width of the gap region TG is defined by the distance between the electrode fingers and stub fingers connected to the opposite busbar. The electrode fingers have an increased metallization ratio $\eta$ in the inner edge regions IRB.

Figure 14B:
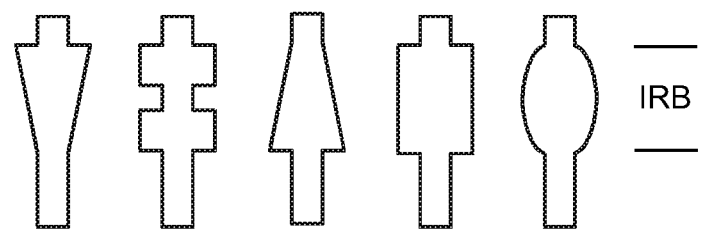

FIG. 14B shows various embodiments of the finger widening which are possible for the inner edge regions. The finger width can increase or decrease linearly within the inner edge regions. A plurality of widened sections are possible between which the finger width is reduced. Moreover, it is possible to arrange elliptically shaped finger widenings.

FIG. 15A shows a configuration of a transducer in which finger electrodes are widened in the inner edge regions and are covered by regions of a weighting layer.

FIG. 15B shows a configuration of a transducer in which in addition to the finger electrodes in the inner edge regions rectangularly shaped weighting elements are arranged alongside the electrode fingers.

FIG. 15C shows a configuration of a transducer in which the inner edge regions are completely covered by a dielectric weighting layer.

Figure 16A:
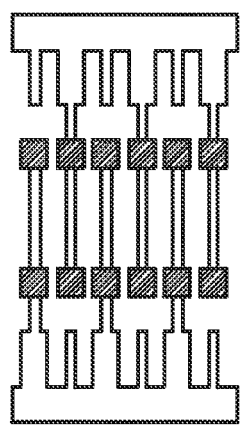

FIG. 15D shows further design possibilities for increasing the mass covering in the inner edge regions. It is possible to arrange rectangularly shaped sections of a weighting layer on the electrode fingers in the inner edge regions. In this case, the widths of these rectangles can be greater than, less than or exactly equal to the width of the electrode fingers. It is furthermore possible to arrange rectangular elements in the inner edge regions which overlap the electrode finger edges. Elliptically shaped weighting sections can also be arranged in the inner edge regions on the electrode fingers:

FIG. 16A shows a configuration of a transducer, wherein outer edge regions ARB comprise stub fingers. In addition, the electrode fingers are wider in the outer edge regions ARB than in the gap regions TG and in the central excitation region ZAB. The inner edge regions comprise rectangular or square sections of a weighting layer which are arranged on the electrode fingers.

Figure 16B:
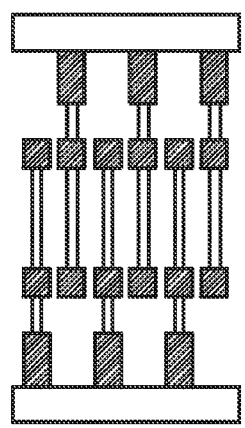

FIG. 16B shows a configuration of a transducer, wherein rectangular sections of a weighting layer are arranged on the electrode fingers in the outer edge regions.

Figure 16C:
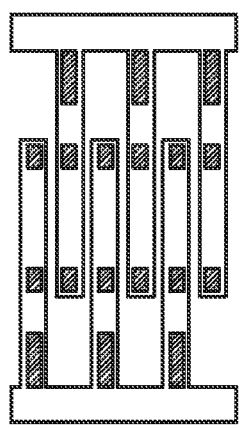

FIG. 16C shows a configuration of a transducer in which rectangularly configured sections of a weighting layer are arranged both in the inner edge regions and in the outer edge regions on the electrode fingers. In this case, the width of the sections of the weighting layer is less than the width of the electrode fingers.

FIG. 17A shows a configuration of a transducer, wherein rectangularly configured sections of a weighting layer are arranged in the inner edge regions on the electrode fingers. In this case, the width of the sections is constant for all electrode fingers of one electrode and differs from the widths of the respective other electrode.

FIG. 17B shows a configuration of a transducer in which rectangularly configured elements of a weighting layer are arranged in the inner edge regions and in the outer edge regions on the electrode fingers. In this case, the widths of the elements of the weighting layer are different in the outer edge regions and in the inner edge regions. Elements of the weighting layer which are arranged in the inner edge regions bring about a phase weighting.

FIG. 17C shows a configuration of a transducer, wherein the electrode fingers have a smaller width in the inner edge regions than in the central excitation region. In addition, the inner edge regions are covered by a dielectric weighting layer.

FIG. 17D shows a configuration of a transducer, wherein sections of a weighting layer which are arranged in the inner edge regions cause a phase weighting as a result of an asymmetrical arrangement on the electrode fingers.

FIG. 17E shows a configuration of a transducer, wherein trapezoidal sections of a weighting layer are arranged in the inner edge regions on the electrode fingers. In this case, the mass covering increases linearly within the inner edge regions for one electrode, while the mass covering decreases from the inner area outward in the inner edge regions for the respective other electrode.

FIG. 18A shows a configuration of a transducer, wherein the outer edge region is subdivided into two partial regions. In innermost sections of the outer edge region, the thickness of the electrode fingers corresponds to that thickness of the electrode fingers in the central excitation region. The electrode fingers are widened in inner partial regions of the outer edge regions. In outer partial regions of the outer edge regions, the thickness of the electrode fingers is equal to that thickness of the electrode fingers in the central excitation region.

FIG. 18B shows a configuration of a transducer, wherein in inner partial regions of the outer edge regions all electrode fingers of an electrode are connected to a conductive or insulating material.

FIG. 18C shows a configuration of a transducer, wherein in inner partial regions of the outer edge regions a weighting layer is arranged on the electrode fingers.

FIG. 18D shows a configuration of a transducer, wherein—floating—rectangular sections of the electrode material, which are not connected to an electrode, are arranged in inner partial regions of the outer edge regions.

FIG. 18E shows a configuration of a transducer, wherein rectangular elements of a weighting layer are arranged periodically along inner partial regions of the outer edge regions. In this case, the period of these elements deviates from the finger period by a factor of greater than or equal to 2.

Figure 19A:
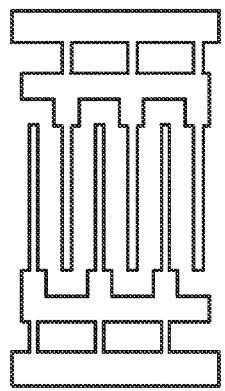

FIG. 19A shows an embodiment of a transducer in which a respective gap region TG is arranged between the inner edge regions IRB and the outer edge regions ARB. The electrode fingers are widened in the gap region. The outer edge regions each comprise an inner partial region ARB1 and an outer partial region ARB2. The inner partial regions ARB1 of the outer edge regions ARB are completely covered by electrode material. In the outer partial regions ARB2 of the outer edge regions ARB, the finger electrodes have the same width as in the central excitation region ZAB.

Figure 19B:
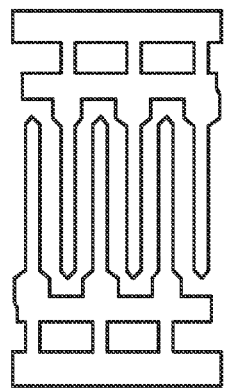

FIG. 19B shows a configuration of a transducer in which gap regions TG are arranged between the outer edge regions ARB and the inner edge regions IRB. Within the gap regions, the finger width remains constant over a partial region of the gap regions. Between said partial region and the inner edge regions, the width of the electrode fingers decreases linearly in the gap region. At the ends of the electrode fingers, the width of the electrode fingers decreases linearly to zero in the gap region.

Figure 19C:
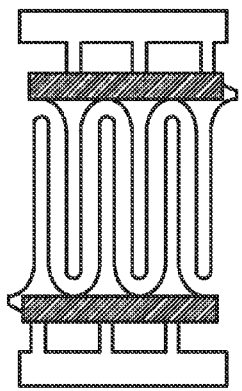

FIG. 19C shows a configuration of a transducer in which the outer edge regions ARB are divided into inner partial regions ARB1 and outer partial regions ARB 2. The inner partial regions ARB1 are covered with a weighting layer. Between the outer edge regions and the inner edge regions, the width of the electrode fingers decreases substantially sinusoidally from the outer area inward. The finger ends of the electrode fingers are configured in substantially round fashion in the gap regions.

Figure 19D:
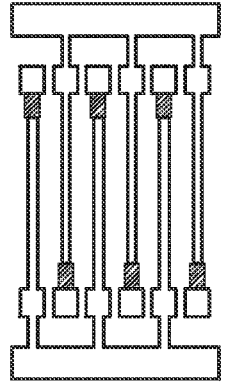

FIG. 19D shows a configuration of a transducer in which in the gap regions TG between the outer edge regions and the inner edge regions at those ends of the electrode fingers which are remote from the busbar, rectangular sections of a dielectric material are arranged on the electrode fingers.

Figure 19E:
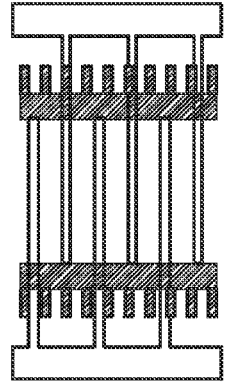

FIG. 19E shows a configuration of a transducer in which the gap regions TG are covered by a dielectric layer. Furthermore, an inner partial region of the outer edge regions is covered with periodically arranged rectangular sections of a weighting layer. In this case, the period of said sections is less than ½ of the wavelength λ.

Figure 19F:
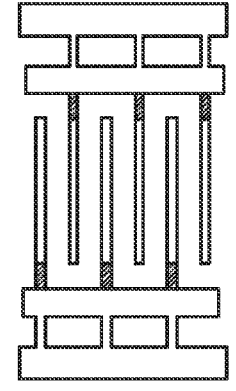

FIG. 19F shows a configuration of a transducer in which those sections of the electrode fingers of the gap regions are covered by a weighting layer.

FIG. 20A shows a configuration of a transducer, wherein gap regions TG are arranged instead of inner edge regions between the outer edge regions ARB and the central excitation region ZAB. The electrode fingers are widened within the gap regions TG.

FIG. 20B shows a configuration of a transducer in which the electrode fingers are widened in constant fashion in outer partial regions of the gap regions TG and in which in inner partial regions of the gap regions the thickness of the finger electrodes decreases linearly from the busbar side to the side of the finger ends.

FIG. 20C shows a configuration of a transducer in which rectangular sections of a weighting layer are arranged in gap regions TG on the electrode fingers.

FIG. 20D shows a configuration of a transducer in which in gap regions TG rectangular sections of a dielectric material are arranged periodically (in a longitudinal direction). The period length of these structures is less than one sixth of the wavelength λ of the acoustic wave.

FIG. 20E shows a configuration of a transducer in which gap regions TG between the outer edge regions ARB and the central excitation region ZAB are completely covered with a dielectric material.

FIG. 21A shows a configuration of a transducer in which the outer edge regions ARB comprise stub fingers between the electrode fingers. Furthermore, the electrode fingers are widened in the outer edge regions. The width of the stub fingers and the width of the widened electrode fingers are substantially identical.

FIG. 21B shows a configuration of a transducer in which in each case three stub fingers per unit length in the unit of the wavelength λ, are arranged in the outer edge regions ARB.

FIG. 21C shows a configuration of a transducer in which outer edge regions are completely covered with a weighting layer.

FIG. 21D shows a configuration of a transducer in which the electrode fingers are covered in the outer edge regions ARB by rectangular segments of a weighting layer. The segments of the weighting layer are in this case wider than the electrode fingers.

FIG. 21E shows a configuration of a transducer, wherein rectangular segments of a weighting layer are arranged in the outer edge regions. The segments cover electrode fingers and the regions between the electrode fingers periodically. In this case, the segments are wider than the electrode fingers. In this case, the period length of the segments is less than one quarter of the period length of the acoustic waves λ.

Figure 22A:
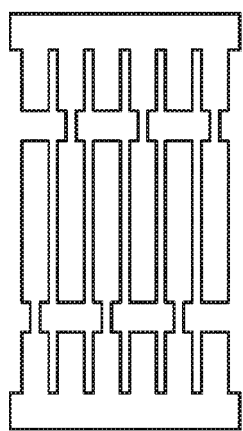

FIG. 22A shows a configuration of a transducer in which the outer edge regions ARB comprise stub fingers. The metallization ratios η in the outer edge regions and in the central excitation region are identical. The metallization ratio in gap regions TG is lower than that in the outer edge regions.

Figure 22B:
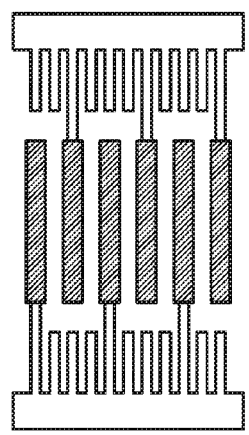

FIG. 22B shows a configuration of a transducer in which the electrode fingers are covered in the central excitation region by rectangular segments of a weighting layer.

Figure 22C:
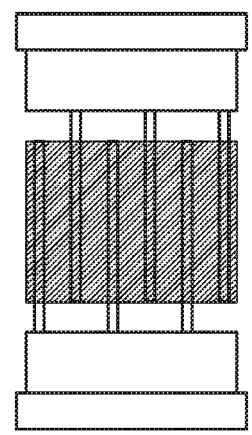

FIG. 22C shows a configuration of a transducer in which the central excitation region is covered by a dielectric layer. Furthermore, the outer edge regions ARB are covered by a weighting layer.

Figure 23:
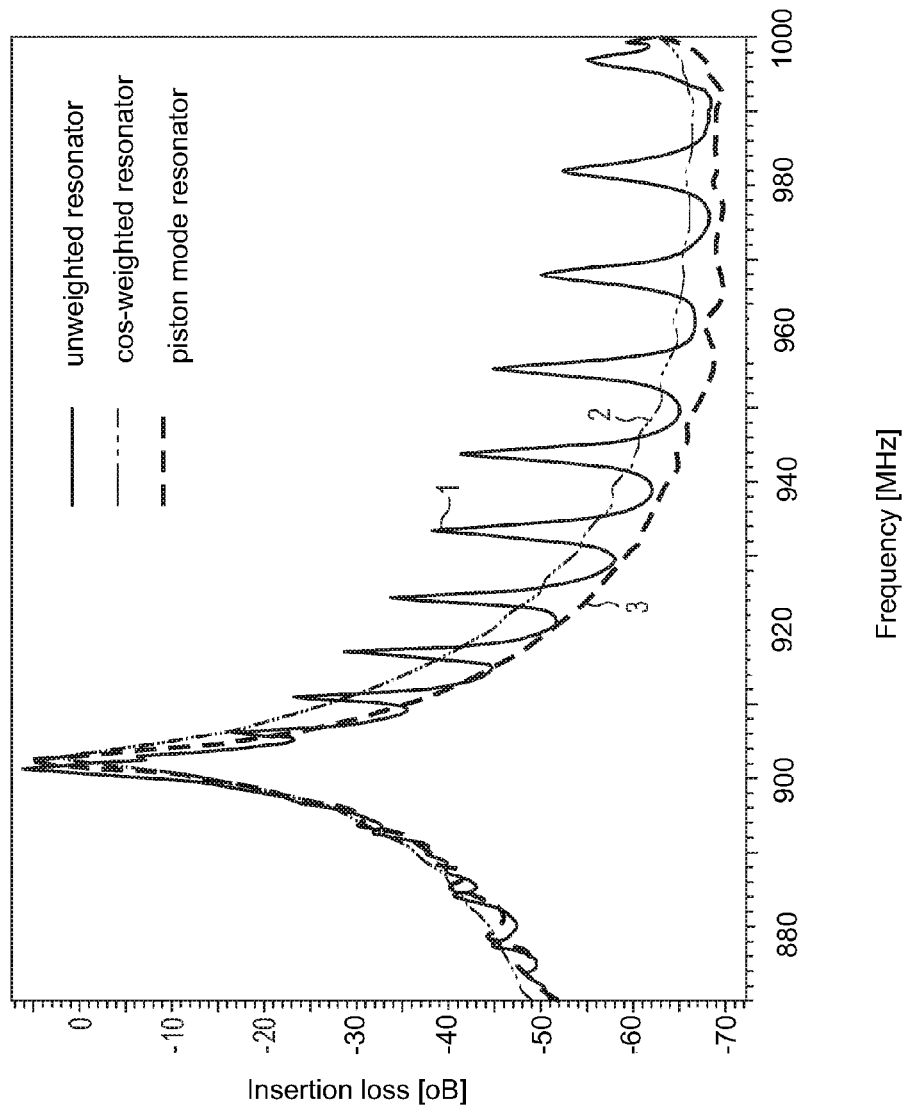
FIG. 23 shows the frequency-dependent insertion loss for transducers of different configurations.

FIG. 23 shows the frequency-dependent insertion loss curves of three transducers. Curve 1 shows the insertion loss of a conventional transducer. Curve 2 shows the insertion loss of a transducer with cosinusoidal weighting. Curve 3 shows the insertion loss of a transducer according to the invention. Curve 1 shows clearly discernible resonances above and below the passband. These resonances are significantly reduced in the case of the insertion loss in curve 2. However, the level of the curve is higher than minima of curve 1. In the case of the insertion loss in accordance with curve 3 of the resonator according to the invention, the manifestation of the resonances is significantly reduced and the curve is at the level of the minima of curve 1.

Figure 24:
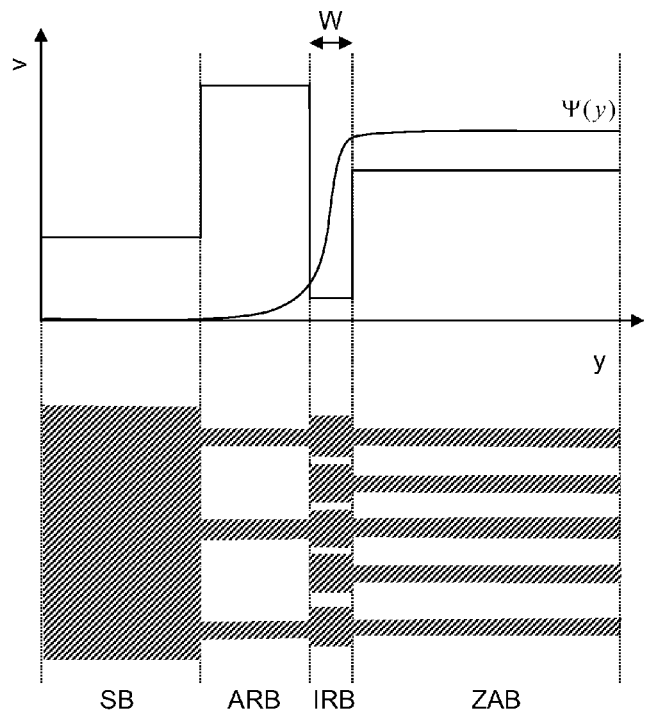
FIG. 24 shows the functioning of a piston mode component in the case of convex slowness.

FIG. 24 illustrates the functioning of a piston mode component in the case of convex slowness. The lower half of the figure shows an excerpt from the device structure having a plurality of transverse sections. In this case, there is an inner edge region IRB having widened fingers, an outer edge regions ARB corresponding to a gap region, and the region of the busbars SB. The upper half of the figure shows the associated transverse velocity profile v(y), and the amplitude of the deflection profile Ψ(y) of the piston mode.

A reduced velocity by comparison with the central excitation region ZAB is present in the inner edge region IRB, and an increased velocity in the outer edge region ARB. The outer edge region ARB serves here as a decay region in which the mode decays exponentially outwardly. On substrates with high coupling or with heavy electrodes, the configuration of the outer edge region ARB as a gap region TG is particularly advantageous since a large difference in velocity with respect to the central excitation region ZAB is obtained here by the omission of every second finger. The utilization of the gap region as a decay region is novel. The outer edge region ARB should have a width at least such that, at its outer edge, the amplitude of the mode has decreased to 10% of the value in the central excitation region ZAB. The inner edge region IRB serves here for adapting a quasi-linear profile of Ψ(y) in the central excitation region ZAB to the exponential profile in the outer edge region ARB. For this purpose, the width W is chosen suitably.

Figure 25:
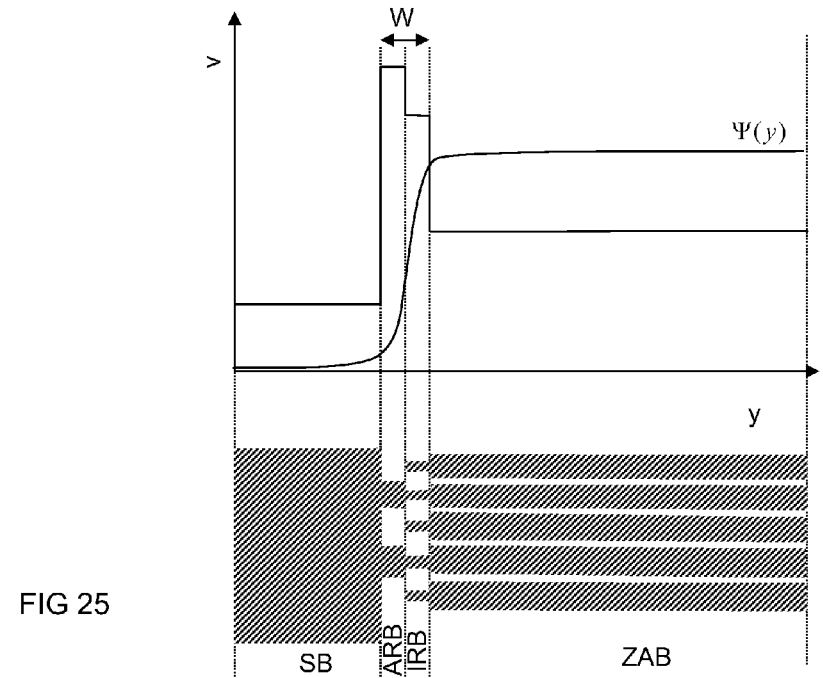
FIG. 25 shows the functioning of a piston mode component in the case of concave slowness.

FIG. 25 illustrates the functioning of a piston mode component in the case of concave slowness. The lower half of the figure shows an excerpt from the device structure having a plurality of transverse sections. In this case, there is an inner edge region IRB having narrowed fingers, an outer edge region ARB corresponding to a gap region, and the region of the busbar SB. The upper half of the figure shows the associated transverse velocity profile v(y), and the amplitude of the deflection profile Ψ(y) of the piston mode. An increased velocity relative to the central excitation region ZAB is present in the inner edge region IRB, and an even higher velocity in the outer edge region ARB. The region of the busbar SB serves here as a decay region in which the mode decays exponentially outwardly. On account of the continuous metallization in the SB, a significant reduction of velocity by comparison with the central excitation region ZAB is achieved here primarily in the case of high layer thicknesses and high coupling on account of the increased mass loading. The width of the region of the busbar SB should be at least large enough that, at its outer edge, the amplitude of the mode has decreased to 10% of the value in the central excitation region ZAB. The inner edge region IRB and the outer edge region ARB serve here jointly for adapting a quasi-linear profile in the central excitation region ZAB to the exponential profile in the region of the busbar SB. For this purpose, the width W, corresponding to the sum of the widths of the inner edge region IRB and of the outer edge region ARB, has to be chosen suitably.

An electroacoustic transducer is not restricted to one of the exemplary embodiments described. Variations comprising, for example, further velocity ranges arranged in lateral regions or correspondingly shaped electrode fingers, or combinations of different embodiments, likewise constitute exemplary embodiments according to the invention.

The invention claimed is:

1. An electroacoustic transducer arranged in an acoustic track, the electroacoustic transducer comprising:
   a piezoelectric substrate;
   two busbars arranged on the substrate;
   two electrodes arranged on the substrate, each electrode having interdigital electrode fingers interconnected with a respective one of the two busbars, the electrodes configured for the excitation of an acoustic wave; and
   a plurality of regions running parallel to the acoustic track, wherein the acoustic wave experiences different longitudinal propagation velocity in each of the regions, the regions comprising:
      a central excitation region with a first longitudinal velocity;
      inner edge regions flanking the central excitation region on both sides, wherein the longitudinal velocity in the inner edge regions deviates from the longitudinal velocity of the central excitation region;
      outer edge regions flanking the inner edge regions, wherein the longitudinal velocity in the outer edge regions is higher than the longitudinal velocity in the inner edge regions or is higher than the longitudinal velocity in the central excitation region;
      regions of the busbars flanking the outer edge regions, wherein the longitudinal velocity in the regions of the busbars is lower than the longitudinal velocity in the outer edge regions;
   wherein $k_x^2+(1+\Gamma)k_y^2=k_0^2$ and $\Gamma>-1$, when the longitudinal velocity in the outer edge regions is higher than the longitudinal velocity in the inner edge regions;
   wherein and $k_x^2+(1+\Gamma)k_y^2=k_0^2$ and $\Gamma<-1$, when the longitudinal velocity in the outer edge regions is higher than the longitudinal velocity in the central excitation region;
   wherein the longitudinal velocity is higher in the inner edge region than in the central excitation region; and
   wherein $k_x$ is a component of a wave vector in a longitudinal direction, $\Gamma$ is an anisotropy factor, $k_y$ is a component of the wave vector in a transverse direction, and $k_0$ is the wave vector in a main propagation direction.

2. The electroacoustic transducer as claimed in claim 1, wherein the longitudinal velocity in the outer edge regions is higher than the longitudinal velocity in the inner edge regions and wherein $k_x^2+(1+\Gamma)k_y^2=k_0^2$ and $\Gamma<-1$.

3. The electroacoustic transducer according to claim 2, wherein the longitudinal velocity is lower in the inner edge regions than in the central excitation region.

4. The electroacoustic transducer as claimed in claim 1, wherein the longitudinal velocity in the outer edge regions is higher than the longitudinal velocity in the central excitation region and wherein $k_x^2+(1+\Gamma)k_y^2=k_0^2$ and $\Gamma<-1$.

5. The electroacoustic transducer as claimed in claim 1, wherein the piezoelectric substrate has a higher electroacoustic coupling coefficient than quartz.

6. The electroacoustic transducer as claimed in claim 1, wherein the electrode fingers, at least in sections along the transverse direction, are wider within the inner edge regions than in the central excitation region.

7. The electroacoustic transducer as claimed in claim 1, wherein the electrode fingers, at least in sections along the transverse direction, are narrower within the inner edge regions than in the central excitation region.

8. The electroacoustic transducer as claimed in claim 1, wherein a width of the electrode fingers, at least in sections along the transverse direction, changes linearly within the inner edge regions.

9. The electroacoustic transducer as claimed in claim 1, wherein heights of the electrode fingers, at least in sections along the transverse direction, are higher within the inner edge regions than in the central excitation region.

10. The electroacoustic transducer as claimed in claim 1, wherein heights of the electrode fingers are higher in the central excitation region than in the inner edge regions, the outer edge regions or the regions of the busbars.

11. The electroacoustic transducer as claimed in claim 1, wherein a height of the electrode fingers within the inner edge regions changes in a stepwise manner at least in sections along the transverse direction.

12. The electroacoustic transducer as claimed in claim 1, wherein a height of the electrode fingers within the inner edge regions increases linearly at least in sections along the transverse direction.

13. The electroacoustic transducer as claimed in claim 1, further comprising a conductive or dielectric material different than a material of the electrode arranged on the electrode fingers in the inner edge regions, at least in lateral sections.

14. The electroacoustic transducer as claimed in claim 13, wherein dielectric material is arranged in the inner edge regions on and between the electrode fingers.

15. The electroacoustic transducer as claimed in claim 1, further comprising hafnium oxide or tantalum oxide arranged on or between the electrode fingers.

16. The electroacoustic transducer as claimed in claim 1, wherein the longitudinal velocity is higher in the outer edge regions than in the central excitation region.

17. The electroacoustic transducer as claimed in claim 1, wherein the longitudinal velocity is higher in the inner edge regions than in the regions of the busbars.

18. The electroacoustic transducer as claimed in claim 1, wherein:
the longitudinal velocity in each of the inner edge regions is identical;
the longitudinal velocity in each of the outer edge regions is identical; and
the longitudinal velocity in each of the regions of the busbars is identical.

19. The electroacoustic transducer as claimed in claim 1, wherein a normalized overlap integral is greater than 0.9; wherein the normalized overlap integral is given by:

$$<\Phi|\Psi>/\sqrt{<\Phi|\Phi><\Psi|\Psi>}\leq 1;$$

where $\Phi$ is a transverse excitation profile and $\Psi$ is a transverse deflection profile.

20. The electroacoustic transducer as claimed in claim 1, wherein a transverse excitation profile of a fundamental mode of the acoustic wave is adapted to a transverse deflection profile by phase weighting in the inner edge region.

21. The electroacoustic transducer as claimed in claim 1, wherein the electrode fingers or the busbars are covered by a dielectric layer.

22. The electroacoustic transducer as claimed in claim 21, wherein the electrode fingers or the busbars are covered by an $SiO_2$ layer.

23. The electroacoustic transducer as claimed in claim 1, wherein the electroacoustic transducer is a GBAW component.

24. The electroacoustic transducer as claimed in claim 1, wherein widths of the outer edge regions are determined by a transverse distance between ends of the electrode fingers of one of the two electrodes and the busbar of the other of the two electrodes.

25. The electroacoustic transducer as claimed in claim 1, wherein widths of the outer edge regions are determined by a transverse distance between ends of the electrode fingers of one of the two electrodes and ends of stub fingers interconnected with the busbar of the other of the two electrodes.

26. The electroacoustic transducer as claimed in claim 1, wherein the electroacoustic transducer is part of a resonator that operates with acoustic waves, having reflectors that delimit the acoustic track in a longitudinal direction.

27. The electroacoustic transducer as claimed in claim 26, wherein the reflector has the same transverse velocity profile of the acoustic waves as the transducer.

28. The electroacoustic transducer as claimed in claim 26, wherein the reflector has reflector fingers having the same construction as the electrode fingers of the transducer in a transverse direction.

29. A method for producing an electroacoustic transducer in an acoustic track as claimed in claim 1, comprising:
providing a piezoelectric substrate;
providing busbars on the substrate;
providing two electrodes arranged on the substrate, each electrode comprising at least one of hafnium or tantalum and having interdigital electrode fingers interconnected with a respective one the busbars, the electrodes configured for excitation of an acoustic wave; and
oxidizing material of the at least one of hafnium or tantalum of the electrode fingers electrodes in an inner edge region;
wherein a plurality of regions run parallel to the acoustic track, wherein the acoustic wave experiences different longitudinal propagation velocity in different ones of the plurality of regions;
wherein the plurality of regions comprises:
a central excitation region, the central excitation region having a longitudinal velocity;
the inner edge regions, which flank the central excitation region on both sides, wherein a longitudinal velocity in the inner edge regions deviates from the longitudinal velocity of the central excitation region;

outer edge regions flanking the inner edge regions, wherein a longitudinal velocity in the outer edge regions is higher than the longitudinal velocity in the inner edge regions or is higher than the longitudinal velocity in the central excitation region; and regions of the busbars flanking the outer edge regions, wherein the longitudinal velocity in the regions of the busbars is lower than the longitudinal velocity in the outer edge regions;

wherein $k_x^2+(1+\Gamma)k_y^2=k_0^2$ and $\Gamma<-1$, when the longitudinal velocity in the outer edge regions is higher than the longitudinal velocity in the inner edge regions;

wherein $k_x^2+(1+\Gamma)k_y^2=k_0^2$ and $\Gamma<-1$, when the longitudinal velocity in the outer edge regions is higher than the longitudinal velocity in the central excitation region; and wherein $k_x$ is a component of a wave vector in a longitudinal direction, $\Gamma$ is an anisotropy factor, $k_y$ is a component of the wave vector in a transverse direction, and $k_0$ is the wave vector in a main propagation direction.

30. An electroacoustic transducer arranged in an acoustic track, the electroacoustic transducer comprising:

a piezoelectric substrate;

two busbars arranged on the substrate;

two electrodes arranged on the substrate, each electrode having interdigital electrode fingers interconnected with a respective one of the two busbars, the electrodes configured for the excitation of an acoustic wave;

a plurality of regions running parallel to the acoustic track, wherein the acoustic wave experiences different longitudinal propagation velocity in each of the regions, the regions comprising:

a central excitation region with a first longitudinal velocity, outer edge regions flanking inner edge regions and the central excitation region on both sides, wherein the longitudinal velocity in the outer edge regions deviates from the longitudinal velocity of the central excitation region and wherein the longitudinal velocity is higher in the inner edge regions than in the central excitation region;

regions of the busbars flanking the outer edge regions, wherein the longitudinal velocity in the regions of the busbars is lower than the longitudinal velocity in the outer edge regions;

wherein $k_x^2+(1+\Gamma)k_y^2=k_0^2$ and $\Gamma<-1$; and wherein $k_x$ is a component of a wave vector in a longitudinal direction, $\Gamma$ is an anisotropy factor, $k_y$ is a component of the wave vector in a transverse direction, and $k_0$ is the wave vector in a main propagation direction.

31. An electroacoustic transducer arranged in an acoustic track, the electroacoustic transducer comprising:

a piezoelectric substrate;

two busbars arranged on the substrate;

two electrodes arranged on the substrate, each electrode having interdigital electrode fingers interconnected with a respective one of the two busbars, the electrodes configured for the excitation of an acoustic wave;

a material that is one of hafnium oxide or tantalum oxide and that is disposed on or between the electrode fingers;

a plurality of regions running parallel to the acoustic track, wherein the acoustic wave experiences different longitudinal propagation velocity in each of the regions, the regions comprising:

a central excitation region with a first longitudinal velocity;

inner edge regions flanking the central excitation region on both sides, wherein the longitudinal velocity in the inner edge regions deviates from the longitudinal velocity of the central excitation region;

outer edge regions flanking the inner edge regions, wherein the longitudinal velocity in the outer edge regions is higher than the longitudinal velocity in the inner edge regions or is higher than the longitudinal velocity in the central excitation region;

regions of the busbars flanking the outer edge regions, wherein the longitudinal velocity in the regions of the busbars is lower than the longitudinal velocity in the outer edge regions;

wherein $k_x^2+(1+\Gamma)k_y^2=k_0^2$ and $\Gamma<-1$, when the longitudinal velocity in the outer edge regions is higher than the longitudinal velocity in the inner edge regions;

wherein $k_x^2+(1+\Gamma)k_y^2=k_0^2$ and $\Gamma<-1$, when the longitudinal velocity in the outer edge regions is higher than the longitudinal velocity in the central excitation region; and wherein $k_x$ is a component of a wave vector in a longitudinal direction, $\Gamma$ is an anisotropy factor, $k_y$ is a component of the wave vector in a transverse direction, and $k_0$ is the wave vector in a main propagation direction.

* * * * *

UNITED STATES PATENT AND TRADEMARK OFFICE
CERTIFICATE OF CORRECTION

PATENT NO. : 9,257,960 B2  Page 1 of 1
APPLICATION NO. : 13/520533
DATED : February 9, 2016
INVENTOR(S) : Werner Ruile It is certified that error appears in the above-identified patent and that said Letters Patent is hereby corrected as shown below:

In the Claims

In Col. 21, line 6, claim 2, delete "$\Gamma < -1$" and insert --$\Gamma >= -1$--.

In Col. 22, line 9, claim 19, delete "where (1)" and insert --where □--.

In Col. 22, line 52, claim 29, delete "one the busbars," and insert --one of the busbars,--.

In Col. 22, line 55, claim 29, delete "electrode fingers".

In Col. 23, line 10, claim 29, delete "$\Gamma < -1$" and insert --$\Gamma > -1$--.

In Col. 23, line 45, claim 30, delete "$\Gamma < -1$" and insert --$\Gamma >= -1$--.

In Col. 24, line 35, claim 31, delete "$\Gamma < -1$" and insert --$\Gamma >= -1$--.

Signed and Sealed this
Third Day of May, 2016

Michelle K. Lee
*Director of the United States Patent and Trademark Office*